(12) United States Patent
Kim

(10) Patent No.: US 8,472,245 B2
(45) Date of Patent: Jun. 25, 2013

(54) NONVOLATILE MEMORY DEVICE, SYSTEM AND PROGRAMMING METHOD WITH DYNAMIC VERIFICATION MODE SELECTION

(75) Inventor: Moo Sung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 216 days.

(21) Appl. No.: 13/012,037

(22) Filed: Jan. 24, 2011

(65) Prior Publication Data
US 2011/0292724 A1 Dec. 1, 2011

Related U.S. Application Data

(60) Provisional application No. 61/349,995, filed on May 31, 2010.

(30) Foreign Application Priority Data

May 31, 2010 (KR) ........................ 10-2010-0051190

(51) Int. Cl.
*G11C 11/34* (2006.01)
(52) U.S. Cl.
USPC ............ 365/185.03; 365/185.17; 365/185.19; 365/185.24; 365/185.33

(58) Field of Classification Search
USPC ............ 365/185.03, 185.17, 185.19, 185.33, 365/185.24
See application file for complete search history.

(56) References Cited

U.S. PATENT DOCUMENTS

| 7,590,007 | B2 | 9/2009 | Futatsuyama | |
|---|---|---|---|---|
| 2005/0083735 | A1* | 4/2005 | Chen et al. | 365/185.17 |
| 2009/0059660 | A1* | 3/2009 | Lee et al. | 365/185.02 |
| 2009/0154238 | A1* | 6/2009 | Lee | 365/185.03 |
| 2009/0213652 | A1 | 8/2009 | Park et al. | |
| 2010/0034019 | A1 | 2/2010 | Kang et al. | |

FOREIGN PATENT DOCUMENTS

| JP | 2009037720 A | 2/2009 |
|---|---|---|
| JP | 2009205793 A | 9/2009 |
| KR | 1020090092099 A | 8/2009 |
| KR | 1020100018318 A | 2/2010 |

* cited by examiner

*Primary Examiner* — Pho M Luu
*Assistant Examiner* — Thao Bui
(74) *Attorney, Agent, or Firm* — Volentine & Whitt, PLLC

(57) ABSTRACT

Nonvolatile memory devices, memory systems and related methods of operating nonvolatile memory devices are presented. During a programming operation, the nonvolatile memory device is capable of using bit line forcing, and is also capable of selecting a verification mode for use during a verification operation from a group of verification modes on the basis of an evaluated programming condition.

20 Claims, 30 Drawing Sheets

VERIFICATION PULSE

VERIFICATION PULSE

NONVOLATILE MEMORY DEVICE, SYSTEM AND PROGRAMMING METHOD WITH DYNAMIC VERIFICATION MODE SELECTION

CROSS-REFERENCE TO RELATED APPLICATIONS

This U.S. non-provisional patent application claims priority under 35 U.S.C. §119 to Korean Patent Application No. 10-2010-0051190 filed May 31, 2010, the subject matter of which is hereby incorporated by reference.

BACKGROUND

The present disclosure relates to a nonvolatile memory devices, memory systems (including memory cards) incorporating same, and methods of programming nonvolatile memory devices. More particularly, the disclosure relates to methods of operating a nonvolatile memory device and/or memory system that provide an ability to dynamically select between different verification modes used during the programming of nonvolatile memory cells.

Nonvolatile memory and related memory systems have become design mainstays within contemporary consumer electronics and digital data systems. Nonvolatile memory allows a large volume of data to be stored by a relatively small integrated circuit device that may be reliably operated with low power consumption, and yet may afford relatively fast data access. Unlike volatile forms of memory (e.g., DRAM and SRAM), nonvolatile memory is able to retain stored data in the absence of applied power.

There are different types of nonvolatile memory. One widely used type is the Electrically Erasable and Programmable Read Only Memory (EEPROM). EEPROM comes in different forms including the various types of flash memory.

In early forms, the individual nonvolatile memory cells stored only a single bit of binary data ("1" or "0"). Such memory cells are referred to a single level memory cells (SLC) and are still widely used. However, many contemporary nonvolatile memory cells are able to store 2 or more bits of data, and are generally referred to as multi-level memory cells (MLC). MLCs offer increased data integration density, but do so at the price of increasingly complex methods of operation (e.g., programming, reading, and erase operations).

The threshold voltage exhibited by a MLC must be accurately programmed within a desired (or "target") threshold voltage distribution. The voltage range of the threshold voltage distribution indicates a corresponding data state for the programmed MLC. As the number of valid MLC data states increases (e.g., four (4) states for a 2-bit MLC, and eight (8) states for a 3-bit MLC, etc.) so too does the number of corresponding threshold voltage distributions. This expanded number of data states and corresponding threshold voltage distributions presents a number of challenges to contemporary nonvolatile memory designers. One particular challenge is managing the design and operating trade-offs between programming speed and programming accuracy. Another challenge is managing the useful life of nonvolatile memory cells in view of the great multiplicity of applied programming and erase operations.

SUMMARY

Embodiments of the inventive concept provide methods of operating a nonvolatile memory device and/or memory system capable of providing improved combinations of programming accuracy and programming speed.

Certain embodiments of the inventive concept provide a method of operating a nonvolatile memory device, the method including; executing an i-th programming interval of a programming operation directed to a memory cell by applying an i-th programming voltage to a word line connected to the memory cell and applying either (1) a bit line forcing voltage to a bit line connected to the memory cell if the memory cell is a fast memory cell or (2) a bit line program voltage less than the bit line forcing voltage to the bit line if the memory cell is a slow memory cell, evaluating a programming condition, selecting a verification mode from a group of verification modes on the basis of the evaluated programming condition, and executing a verification operation using the selected verification mode in relation to the memory cell.

Certain embodiments of the inventive concept provide a method of programming a multi-level memory cell (MLC) configured to store data including a least significant bit (LSB) and a most significant bit (MSB) within a nonvolatile memory device, the method including; executing an i-th programming interval comprising a LSB programming operation followed by a MSB programming operation, wherein the MSB programming operation includes; applying an i-th programming voltage to a word line connected to the MLC and applying either (1) a bit line forcing voltage to a bit line connected to the MLC if the memory cell is a fast memory cell, or (2) a bit line program voltage less than the bit line forcing voltage to the bit line connected to the MLC if the memory cell is a slow memory cell, evaluating a programming condition, selecting a verification mode from a group of verification modes on the basis of the evaluated programming condition, and executing a verification operation using the selected verification mode.

Certain embodiments of the inventive concept provide a method of operating a nonvolatile memory device, the method including; executing an i-th programming interval of a programming operation directed to a memory cell by applying an i-th programming voltage to a word line connected to the memory cell and applying either (1) a bit line forcing voltage to a bit line connected to the memory cell if the memory cell is a fast memory cell or (2) a bit line program voltage less than the bit line forcing voltage to the bit line if the memory cell is a slow memory cell, comparing a current threshold voltage of the memory cell to a pass threshold voltage, if the current threshold voltage is less than the pass threshold voltage selecting a first verification mode, and if the current threshold voltage is greater than or equal to the pass threshold voltage selecting a second verification mode.

Certain embodiments of the inventive concept provide a nonvolatile memory device, comprising; a memory cell array comprising a memory cell connected to a word line and a bit line, a voltage generator configured to generate a plurality of control voltages including a programming voltage, an address decoder configured to connect the programming voltage to the word line in response to an externally provided address, a page buffer circuit configured to connect a bit line voltage to the bit line in response to the externally provided address, and control logic configured to control the voltage generator and address decoder to execute an i-th programming interval of a programming operation directed to the memory cell by applying an i-th programming voltage as the programming voltage, and to control the page buffer circuit to apply either (1) a bit line forcing voltage to the bit line if the memory cell is a fast memory cell, or (2) a bit line program voltage less than the bit line forcing voltage to the bit line if the memory cell is a slow memory cell. The control logic is further configured to evaluate a programming condition, select a verification mode from a group of verification modes on the basis of the evaluated programming condition, and control the voltage generator, address decoder and page buffer circuit to execute a verification operation using the selected verification mode.

Certain embodiments of the inventive concept provide a memory system, comprising; a nonvolatile memory device comprising a memory cell connected between a word line and a bit line, and a memory controller configured to control the operation of the nonvolatile memory device. The nonvolatile memory device comprises control logic configured to receive a command from the memory controller and execute a programming operation in relation to the memory cell by executing an i-th programming interval of the programming operation by applying an i-th programming voltage to the word line, and applying either (1) a bit line forcing voltage to the bit line if the memory cell is a fast memory cell or (2) a bit line program voltage less than the bit line forcing voltage to the bit line if the memory cell is a slow memory cell, evaluating a programming condition, selecting a verification mode from a group of verification modes on the basis of the evaluated programming condition, and executing a verification operation using the selected verification mode in relation to the memory cell.

BRIEF DESCRIPTION OF THE DRAWINGS

The accompanying drawings illustrate in relevant aspects certain embodiments of the inventive concept.

DETAILED DESCRIPTION OF THE EMBODIMENTS

Exemplary embodiments of the inventive concept will be described hereafter in some additional detail with reference to the accompanying drawings. The inventive concept may, however, be embodied in different forms and should not be construed as being limited to only the illustrated embodiments. Rather, the illustrated embodiments are provided so that this disclosure will be thorough and complete, and will fully convey the scope of the inventive concept to those skilled in the art.

The illustrated embodiments are drawn to flash memory devices, memory systems incorporating flash memory devices, and related methods of operation. However, these examples are merely representative of many different type of nonvolatile memory that may fall within the scope of the inventive concept. Thus, those skilled in the art will recognize that the teachings of the subject disclosure, using embodiments drawn specifically to flash memory devices, may be extended to other forms of nonvolatile memory.

For example, a nonvolatile memory device according to embodiments of the inventive concept may be a NAND flash memory, a vertical NAND flash memory, a NOR flash memory, a Resistive Random Access Memory (RRAM), a Phase-change Random Access Memory (PRAM), a Magneto-resistive Random Access Memory (MRAM), a Ferroelectric Random Access Memory (FRAM), and a Spin Transfer Torque Random Access Memory (STT-RAM). Moreover, a nonvolatile memory device according to an embodiment of the inventive concept may be implemented in a Three-Dimensional (3D) array structure. Certain nonvolatile memory devices according to embodiments of the inventive concept may be applied to a flash memory device where a charge storage layer is configured with a conductive floating gate, and a Charge Trap Flash (CTF) or where a charge storage layer is configured with a dielectric.

Figure 1:
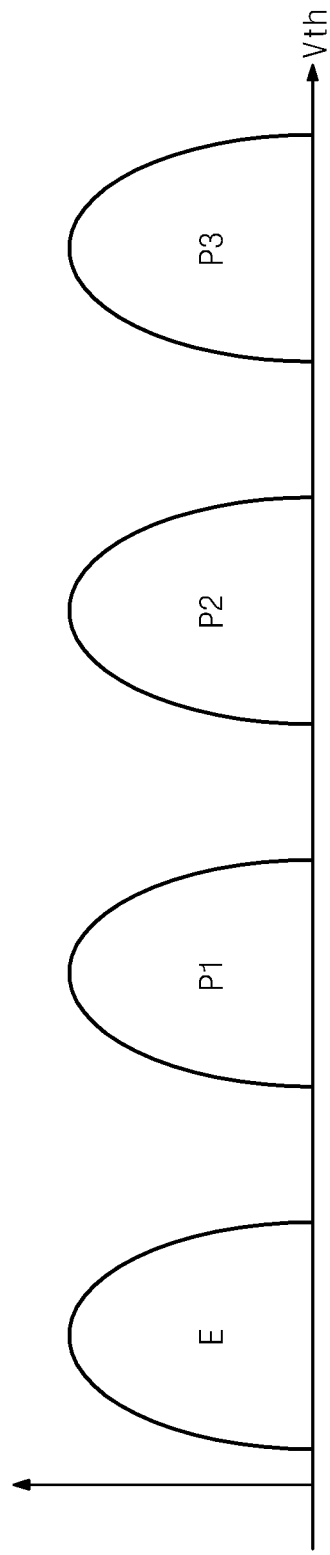
FIG. 1 illustrates a conventionally understood threshold voltage distribution for an exemplary 2-bit MLC.

There are many conventionally understood approaches to the operation and programming of nonvolatile memory cells. As noted above, the threshold voltage exhibited by a nonvolatile memory cell may be programmed to reside within one of a number of threshold voltage distributions. FIG. 1 generally illustrates four (4) threshold voltage distributions associated with an exemplary 2-bit MLC. An erase state (E) and first through third programming states (P1, P2 and P3) for the nonvolatile memory cell are indicted by a respective and corresponding threshold voltage distributions. One design objective for nonvolatile memory system incorporating MLCs is the efficient and accurate programming of the MLCs, typically from the erase state to one of the programming states.

Nonvolatile memory cell programming is typically an iterative process, wherein one or more programming steps or loops (i.e., the application of specific control voltages to one or more nonvolatile memory cell(s) selected within the nonvolatile memory system) are performed over a succession of programming intervals. As many programming intervals as are necessary to properly program a selected nonvolatile memory cell may be performed during a defined programming period. Further, the use of finely (or narrowly) defined programming increments (i.e., control voltage level differences between successive programming intervals) allows nonvolatile memory cells to be accurately programmed within defined threshold voltage distributions. However, programming efficiency dictates that the number of programming intervals required to properly program a nonvolatile memory cell be kept to a minimum. Thus, nonvolatile memory system designers seek to balance (1) a desire to accurately program a nonvolatile memory cell using many, narrowly defined programming increments with (2) a desire to minimize the overall number of programming intervals by closing upon a target memory cell threshold voltage as rapidly as possible.

Recognizing the need to balance these opposing objectives, nonvolatile memory system designers have developed a number of different programming schemes. One scheme is commonly referred to as "bit line forcing". One example of a bit line forcing scheme is illustrated in FIG. 2, inclusive of FIGS. 2A and 2B.

Figure 2A:
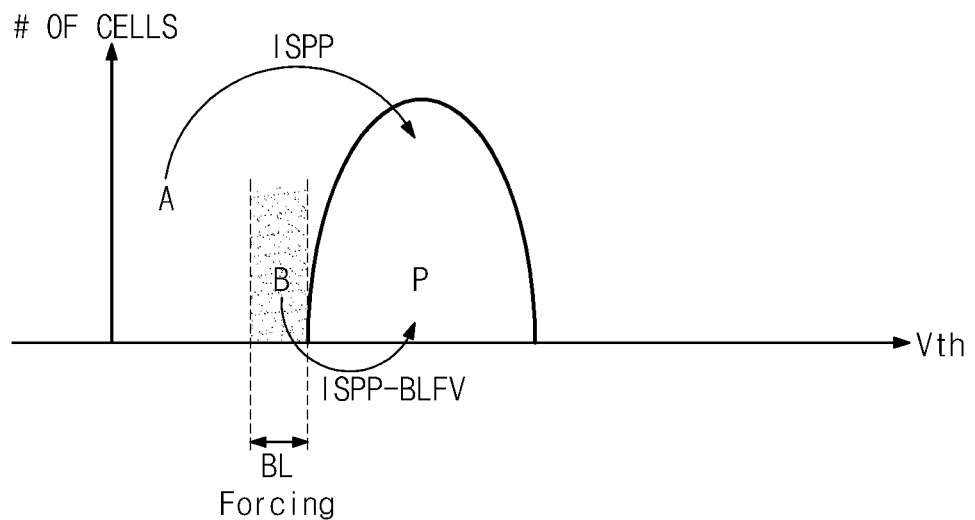
FIG. 2, inclusive of FIGS. 2A and 2B, conceptually illustrates a programming operation for a nonvolatile memory cell incorporating bit line forcing according to embodiments of the inventive concept.
Figure 2B:
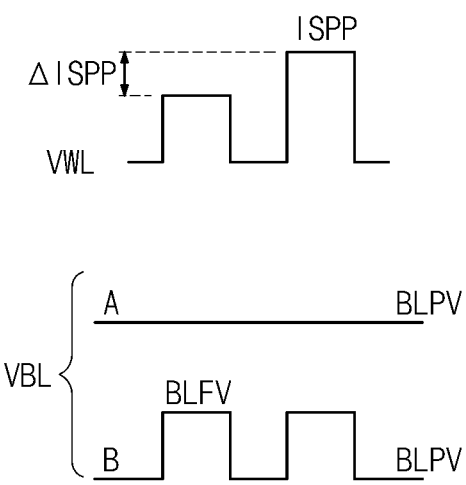

FIG. 2A illustrates a desired threshold voltage distribution P to which a selected nonvolatile memory cell is to be programmed. It is further assumed that the programming operation used to program the nonvolatile memory cell uses a conventionally understood increment step programming procedure (ISPP), wherein successive programming intervals are characterized by different (usually increasing) control voltage levels (e.g., word line and bit line voltages). FIG. 2B illustrates a word line voltage (VWL) applied to a word line connected to a selected nonvolatile memory cell that is increases during each successive programming interval by a ISPP-defined step increment ($\Delta$ISPP).

The current threshold voltage of a nonvolatile memory cell during any arbitrarily selected programming interval may be assumed to reside within one of three (3) threshold voltage (Vth) regions; (1) the target threshold voltage distribution range "P" (i.e., Vth is greater than a corresponding verification voltage (VR)), (2) a proximate threshold voltage range "B" (i.e., Vth is less than VR but greater than a pre-verification voltage (PVR)), or (3) a distant threshold voltage range "A" (i.e., Vth is less than PVR).

During a programming operation selectively using bit line forcing, the nature (e.g., level and/or duration) of the control voltages applied to a memory cell is determined by the current threshold voltage of the memory cell. One example of a programming operation using bit line forcing is conceptually illustrated in FIG. 2. Here, it is assumed that a number of programming loops are executed during a number of programming interval. Depending on the current threshold voltage of the selected memory cell, each programming loop may apply either a bit line forcing control voltages or normal programming control voltages. That is, when the current threshold voltage of the selected nonvolatile memory cell resides in the proximate threshold voltage range B, bit line forcing control voltages are applied to the memory cell. However, when the current threshold voltage of the selected memory cell resides in the distant threshold voltage range A, bit line forcing is not applied but instead normal programming control voltages are applied to the memory cell.

As suggested by the voltage waveforms of FIG. 2B, bit line forcing control voltages may include a bit line forcing voltage (BLFV) applied to the bit line connected to the selected memory cell. In certain embodiments of the inventive concept like the one illustrated in FIG. 2B, the BLFV may have a level in a range of between about 0.3 to 1.5V. In contrast, normal programming control voltages may include a bit line programming voltage (BLPV), less than the BLFV, applied to the bit line of the selected memory cell. In certain embodiments of the inventive concept like the one illustrated in FIG. 2B, the BLPV may have a level in a range of between about 0.0 to 0.9V. These disparate bit line voltages (BLPV verses BLFV) are applied while an ISPP-defined VWL is applied to the word line connected to the selected memory cell during any given programming interval.

In certain embodiments of the inventive concept, the bit line forcing voltage BLFV is greater than the bit line program voltage BLPV, but less than a conventionally understood bit line program-inhibit voltage (e.g., a power source voltage). Unlike memory cells being programmed by application of the bit line program voltage BLPV and bit line forcing voltage BLFV, memory cells connected to bit lines receiving the bit line program-inhibit voltage are not programmed (e.g., these memory cells may already exhibit a threshold voltage within the target threshold distribution P).

In this manner, bit line forcing is performed for selected memory cell(s) having a current threshold voltage in the proximate threshold voltage range B, while normal ISPP programming is performed for selected memory cell(s) having a current threshold voltage in the distant threshold voltage range A. During any given programming interval in an iterative ISPP programming operation, each selected memory cell may be classified as either "programmed" (having a threshold voltage within the target threshold voltage distribution range P), "slow" (having a threshold voltage in the distant threshold voltage range A), or "fast" (having a threshold voltage in the proximate threshold voltage range B). Once classified (or identified), the selected memory cell(s) may be differently treated during a current programming interval or during the next programming interval, depending on when the programmed/slow/fast identification occurs.

In the working example of FIG. 2, a slow memory cell may be programmed during a current programming interval using a normal, ISPP-defined word line voltage VWL. In contrast, fast memory cells may be programmed during a current programming interval using a bit line forcing word line voltage (e.g., an ISPP-defined level minus the BLFV). Accordingly, slow memory cells exhibiting a relatively slow programming speed (i.e., memory cells increasing their threshold voltage at a lesser rate per arbitrary number of applied programming loops) receive the ISPP-defined word line voltage VWL and BLPV as a bitline voltage. Fast memory cells exhibiting a relatively fast programming speed (i.e., memory cells increasing their threshold voltage at a greater rate per arbitrary number of applied programming loops) receive (VWL− BLFV) as a word line voltage and BLFV as a bitline voltage. Under these conditions, the slow memory cells are more greatly voltage-motivated than the fast memory cells, and the threshold voltage of the slow memory cells is more rapidly increased over that of the fast memory cells. This scheme tends to reduce the number of programming loops that must be applied to slow memory cells, thereby reducing nonvolatile memory cell wear and increasing the useful lifetime of the memory cells.

For example, it may be assumed for at least one embodiment of the inventive concept that BLPV is 0V and BLFV is 1V. Memory cells identified as fast memory cells receive the ISPP-BLFV word line voltage and the 1V BLFV during the current programming interval. Memory cells identified as slow memory cells receive the normal ISPP world line voltage, and the 0V BLPV during the current programming interval. Under these conditions, slow memory cells receive a greater threshold voltage motivating difference between word line and bit line voltages during a programming interval, as compared with fast memory cells. If it is further assumed that ΔISPP is about 0.3V per programming interval, the number of programming loops required to properly program a slow memory cell may be decreased markedly.

At this point it should be noted that identification of slow verses fast memory cells in various embodiments of the inventive concept may occur before and/or after the execution of respective programming loop(s). Alternately, the identification of slow/fast memory cells may be performed one-time at the beginning of the overall programming operation (e.g., before the first programming loop). In this regard, the designation of a memory cell as being slow/fast may be retained during the entire programming operation until such time as the memory cell is identified as a programmed memory cell.

However, a memory cell identified as a slow memory cell during an ith−1 programming interval may be re-identified (e.g., identification updated) as a fast memory cell during an ith programming interval. For example, once the threshold voltage exhibited by a memory cell transitions from the distant threshold voltage range A to the proximate threshold voltage range B, the identification of the memory cell may be changed from slow to fast—with corresponding changes to applied programming control voltages during subsequent (ith+1) programming intervals. In this manner, a slow memory cell may be programmed to rapidly move its threshold voltage towards a target threshold distribution P, but then once the threshold voltage is proximate the target threshold distribution, it may be more finely adjusted to accurately complete the programming operation. Both programming efficiency and programming accuracy may thus be achieved.

Within an overall programming methodology, the step of identifying whether selected memory cell(s) are slow or fast memory cell(s) may be performed during a pre-verifying step occurring before iterative programming steps. Alternately or additionally, the step of identifying whether selected memory cell(s) are slow or fast memory cell(s) may be performed in relation to each iterative programming step.

Figure 3:
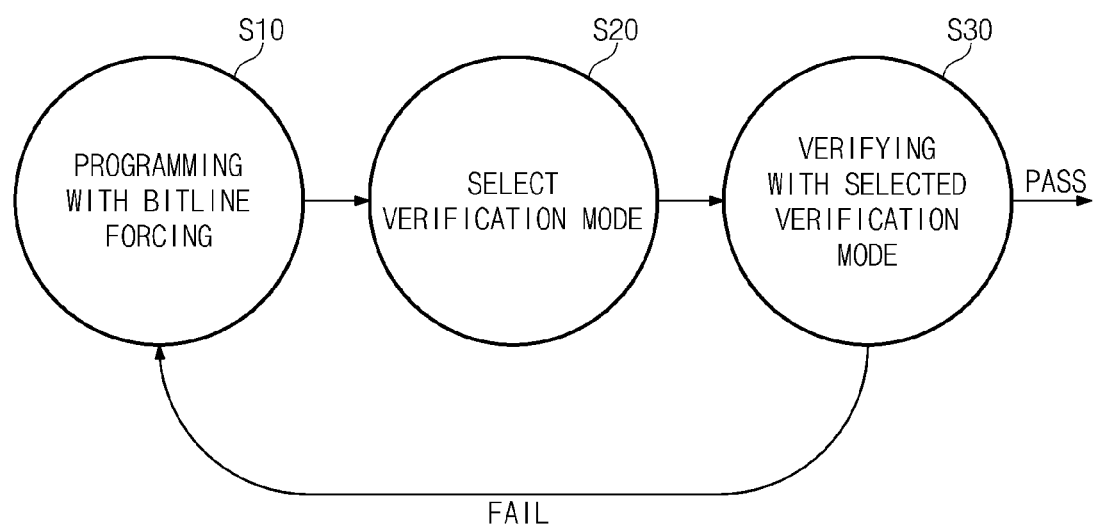
FIG. 3 is a general operations flow diagram illustrating an embodiments of the inventive concept.

FIG. 3 is a general flowchart summarizing a method of operating a nonvolatile memory device according to embodiments of the inventive concept. The method of operating comprises a programming operation incorporating an ability to selectively perform bit line forcing on designated memory cells (e.g., memory cells identified as fast memory cells). As noted above, the ability to perform bit line forcing may be selected on a programming interval-by-programming interval basis for memory cells over a succession of iteratively executed programming intervals within an overall programming operation. For any arbitrarily selected programming interval during which the threshold voltage of at least one selected memory cell reaches a target threshold voltage distribution (or at the completion of the programming operation), therefore, the method of operating a nonvolatile memory system as illustrated in FIG. 3 comprises; performing a programming operation directed to one or more selected memory cell(s), which may include programming by bit line forcing (S10), followed by the selection of a verification mode from a group of possible verification modes on the basis of one or more programming conditions (S20).

As will be described in some additional detail hereafter, such programming condition(s) may include; a number of executed programming loops, a memory cell programming state, a detected (or calculated) noise threshold (e.g., a common source line noise threshold), a temperature threshold, a detected (or calculated) change in a threshold voltage distribution, memory cell bias conditions, respective bit line sensing periods, bit line sensing techniques, etc. Where a noise threshold is used as a programming condition, certain embodiments of the inventive concept will include a conventionally adapted noise sensor, such as a voltage noise sensor. Where a temperature threshold is used as a programming condition, certain embodiments of the inventive concept will include a conventionally adapted temperature sensor.

Once a verification mode has been selected (S20), a verifying operation is performed (S30) in relation to the stored data using the selected verification mode. Should the verifying operation indicate an erroneous state for the stored data (FAIL), the method of operating the nonvolatile memory system returns to the (re-)programming of one or more of the selected memory cell(s) (S10). Otherwise, an indication of successful programming by the verifying operation (PASS), terminates the method of operating.

Thus, embodiments of the inventive concept contemplate the dynamic selection and use of a verification mode from amongst a group of verification modes that may possibly be used during the verifying operation (S30). In certain embodiments of the inventive concept, the group of verification modes includes verification modes using a different number of verification steps. Exemplary single-step verses multiple-step verification modes, and an approach for selecting between same will be described hereafter in some additional detail. It should be noted, however, that a selection between single-step and multiple-step verification modes is merely one example of verification mode selection and related selection procedures that may be used in embodiments of the inventive concept.

The selection between verification modes within embodiments of the inventive concept occurs "dynamically", or within the method of operating—as opposed to being selected in a pre-set manner, or outside the method of operating (e.g., a factory select, or a memory system power-on initialization). In this manner, changing programming conditions for a memory system incorporating one or more nonvolatile memory device(s) according to embodiments of the inventive concept may be accounted for in the verification mode selection (S20) and the use of this appropriate or better optimized verification mode within a verification operation (S30).

Of further note, the step of selecting a verification mode (S20) in the method of operating a nonvolatile memory system, as illustrated in FIG. 3, may be performed following completion of the programming operation. However, this need not be the case and other embodiments of the inventive concept may select an appropriate verification mode before executing the programming operation.

It should also be noted that the terms "programming operation" and "verification operation" are broadly construed within the context of embodiments of the inventive concept. A verification operation is any operation evaluating or improving a threshold voltage exhibited by a previously programmed memory cell in relation to a defined threshold voltage distribution. A programming operation is any operation changing (or intending to change) the threshold voltage of a nonvolatile memory cell.

Figure 4A:
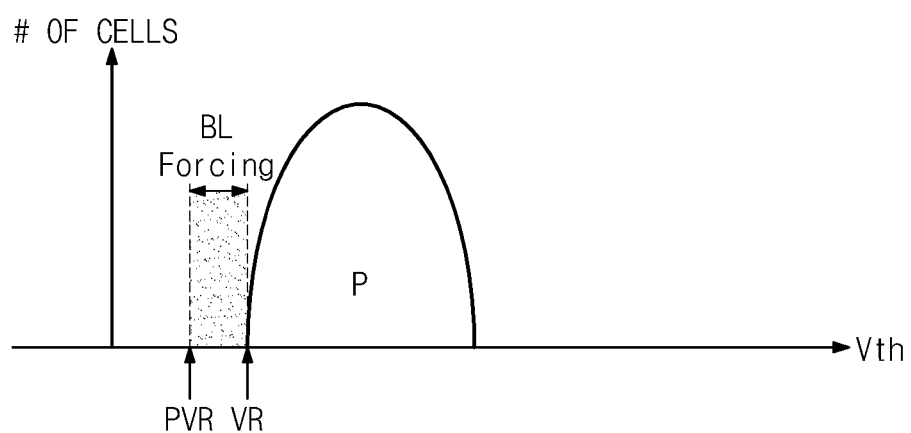
FIG. 4, inclusive of FIGS. 4A and 4B, conceptually illustrates a multiple step verification mode for a nonvolatile memory cell according to embodiments of the inventive concept.
Figure 4B:
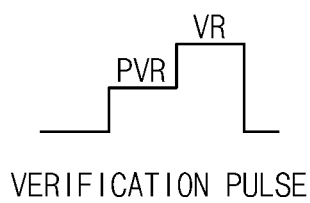

FIG. 4, inclusive of FIGS. 4A and 4B, conceptually illustrates one possible embodiment of a multiple-step verification mode capable of being selected (S20 in FIG. 3) for use within a verification operation according to embodiments of the inventive concept (S30 in FIG. 3). A 2-step verification mode is described herein, but those of ordinary skill in the art will recognize that more than two steps may be used in multiple-step verification modes incorporated within embodiments of the inventive concept.

Referring to FIG. 4, it is assumed that a selected nonvolatile memory cell is being programmed with possible bit line forcing to a target threshold voltage distribution P. A determination as to whether the current threshold voltage falls within the target threshold voltage distribution P is made in relation to a verification voltage VR (e.g., a minimum voltage level within the target threshold voltage distribution P). However, before making this determination (i.e., an Nth verification step in a (N-step) multiple-step verification mode), a first (or succeeding) verifying step is performed in relation to a corresponding pre-verification voltage PVR which is less than the verification voltage VR. In the illustrated example of FIG. 4, a second verifying step is performed in relation to the verification voltage VR following a first verifying step performed in relation to the pre-verification voltage PVR.

Thus, the multiple step verification mode illustrated in FIG. 4 presupposes that at least one selected memory cell(s) has not yet been successfully programmed to a threshold voltage within the target threshold voltage distribution. Following a current programming operation (S10 of FIG. 3), the 2-step verification mode of FIG. 4 is selected (S20 in FIG. 3) and performed (S30 in FIG. 3). If the current threshold voltage of the selected memory cell is determined to be less than the pre-verification voltage PVR during the first verifying step, then the selected memory cell may be designated as a slow memory cell for the next programming interval. During the next iterative programming step, the now designated as slow memory cell(s) may be programmed using normal programming control voltages.

However, if the current threshold voltage of the selected memory cell(s) is determined to be greater than or equal to the pre-verification voltage PVR during the first verifying step, then the second verifying step may be performed in relation to the verification voltage VR. If the current threshold voltage of the selected memory cell is determined to be less than the verification voltage VR (but greater than or equal to the pre-verification voltage PVR) during the second verifying step, then the selected memory cell(s) may be designated as fast for the next programming interval. During the next iterative programming step the now designated as fast memory cell(s) will be programmed using bit line forcing programming control voltages.

It may be further assumed that the first and second verifying steps suggested above each include the sub-steps of pre-charging a bit line, developing the bit line, and sensing the bit line. In this context, for example, during the second verifying step of the multiple-step verification mode illustrated in FIG. 4, a precharge voltage (e.g., a power source voltage or a voltage less than the power source voltage) will not applied to the bit line(s) of memory cell(s) that do not pass the first verifying step (i.e., their threshold voltage is less than the per-verification voltage PVR). In this manner, certain memory cell(s) that do not pass the first verifying step may be excluded from the second verifying step, thereby conserving power within the memory system and reducing noise on a common source line.

In this context, the $1^{st}$ through Mth (where M is less than N) verifying steps of a N-step verification mode may be thought of as "coarse" verifying steps, while M+1th through Nth verifying steps may though of as "fine" verifying steps. The respective number of course verses fine verifying steps may be correlated with applied programming steps (e.g., normal programming verses bit line forcing), and may be balanced to optimize programming speed with programming accuracy.

The voltage waveform of FIG. 4B is one example of a verification pulse that may be used to sequentially verify the threshold voltage of selected memory cell(s). The verification pulse comprises a pre-verification voltage PVR for a first predetermined period of time followed by a verification voltage VR for a second predetermined period of time, where the first and second predetermined periods of time may be different or the same.

Certain benefits associated with the selective use of a multiple-step (e.g., 2-step) verification mode within embodiments of the inventive concept will now be described in relation to FIGS. 5, 6 and 7. In particular, the use of a multiple-step verification mode will be shown to reduce noise on a common source line traversing a constituent memory cell array of a nonvolatile memory device according to embodiments of the inventive concept during a verification operation (S30 in FIG. 3).

Figure 5:
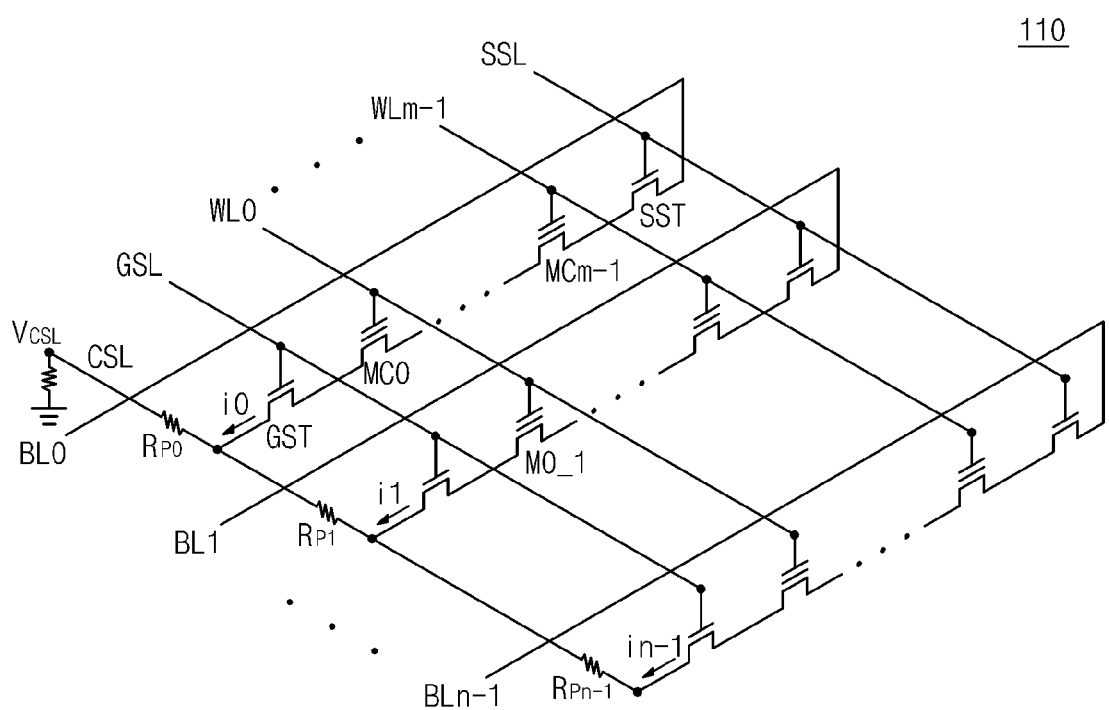
FIG. 5 is a partial circuit diagram of a memory cell array and conceptually illustrates certain problems associated with noise on a common source line.

FIG. 5 is a partial circuit diagram for a memory cell array 110 within an embodiment of the inventive concept. The memory cell array 110 comprises memory cells and corresponding signal lines for a configured memory block having a plurality of cell strings respectively connected to a plurality of bit lines BL0 to $BL_n$. The memory block includes a plurality of memory cells MC0 to $MC_{m-1}$ respectively connected in strings along a respective one of the plurality of bit lines BL0 to $BL_n$ extending between a corresponding string selection transistor SST connected to a string selection line SSL and a ground selection transistor GST connected to a ground selection line GSL. A common source line CSL is disposed adjacent to the ground selection line GSL in the illustrated embodiment, but may be otherwise disposed. Thus, each string selection transistor SST is connected to a bit line BL, and each ground selection transistor GST is connected to the common source line CSL. Moreover, in FIG. 5 resistors $R_{p0}$ to $R_{pn-1}$ conceptually represent a distributed (e.g., parasitic) resistive and capacitive component(s) that exists in relation to the common source line CSL.

During a verification operation, the amount of current flowing through each cell string changes according to the number of ON memory cells in the string. As a result, the load voltage placed on the common source line $V_{CSL}$ changes in accordance with the cumulative changes in current flowing through one or more cell string(s). To further illustrate this phenomenon, it is assumed that the current state of a memory cell $M_0$ connected to a selected word line $WL_0$ is the erase state (E), and the current state of another memory cell $M_{0\_1}$ connected to the same word line $WL_0$ is a programmed state. Thus, when various memory cells connected to the selected word line $WL_0$ ON cells, it may be readily seen that currents $i_0$ and $i_1$ flowing through the respective cell strings be different given the different programming states of the connected memory cells. As a direct outcome of this current variability, the voltage/current loading of the common source line voltage $V_{CSL}$ will change according to the number of ON cells.

For example, when only the memory cell $M_0$ connected to the selected word line $WL_0$ and the bit line $BL_0$ is an ON cell and a memory cell $M_{0\_1}$ connected to the selected word line $WL_0$ of the bit line $BL_1$ is an OFF cell, the voltage applied across the resistor $R_{P0}$ becomes $(i_0 \times R_{P0})$, thereby defining a first level for the common source line voltage $V_{CSL}$. As another example, when the memory cells $M_0$ and $M_{0\_1}$ connected to the selected word line $WL_0$ of the bit line $BL_0$ and $BL_1$ are ON cells, the voltage applied across both resistors $R_{P0} R_{P1}$ becomes $(i_0 \times R_{P0} + i_1 \times R_{P1})$, thereby defining a different common source line voltage $V_{CSL}$.

From this simple example, it may be seen that any reduction in the number of ON cells—as may be effected by the use of a competent multiple-step verification mode—tends to diminish and stabilize the loading of the common source line CSL as the threshold voltage of selected memory cell(s) move towards the target threshold voltage distribution. That is, the number of ON cells during an Nth step of a N-step verification mode will generally be fewer than during a $1^{st}$ step.

Figure 6:
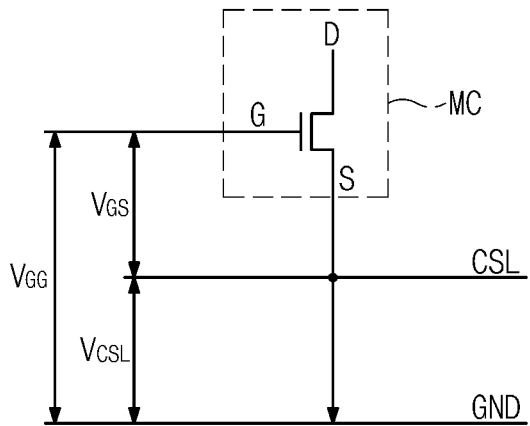
FIG. 6 is a circuit and voltage diagram further illustrating the problem of noise on the common source line in certain memory cell arrays.

FIG. 6 is a conceptual circuit/voltage diagram further illustrating a memory cell in relation to the effects of common source line noise.

Referring to FIGS. 5 and 6, when current flows through the common source line CSL, a voltage change on the common source line CSL will be induced by parasitic resistive and capacitive components. This voltage change on the common source line CSL ($V_{CSL}$) essentially acts as noise voltage. It is assumed that a high voltage generator within the nonvolatile memory device generates a voltage $V_{GG}$ associated with a ground voltage GND. However, a memory cell channel formed during the verification operation is controlled according to a voltage difference $V_{GS}$ between the control gate G and source S of the memory cell. Accordingly, the noise difference $V_{CSL}$ exists between the voltage $V_{GG}$ actually provided to the control gate G of the memory cell and the voltage VGS forming the memory cell channel. Such a common source line voltage $V_{CSL}$ may cause a sense error during the verification operation. Therefore it may be understood that reducing the number of ON memory cells and corresponding ON-cell current during a verification operation (or more particularly during a verification step of a multiple-step verification mode) tends to decrease this type of sensing error.

Figure 7:
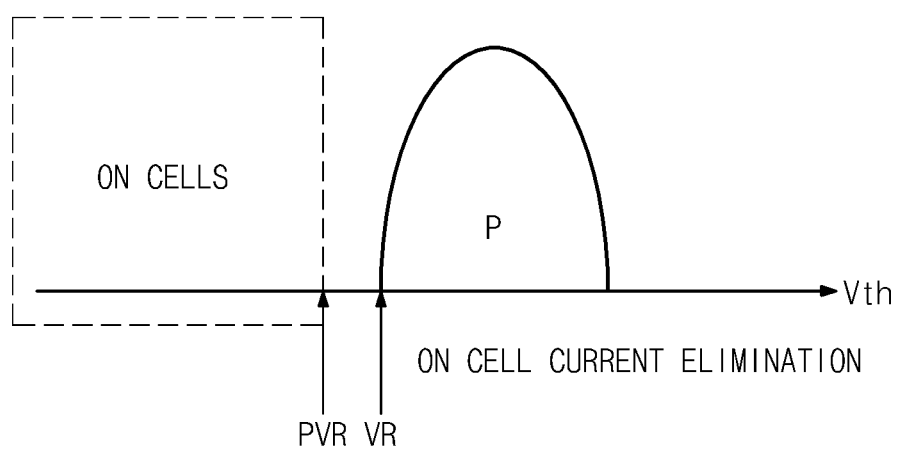
FIG. 7 is a conceptual diagram still further illustrating the problem of noise on the common source line and remedy of same as a function of using a verification operation using a multiple-step verification mode.

FIG. 7 is another conceptual diagram further illustrating the correlation between the use of multiple-step verification modes and reduction of the common source line voltage $V_{CSL}$. Referring to FIG. 7, the bit lines of the ON cells not passed by the first verifying step of the 2-step verification operation of FIG. 4 in accordance with the pre-verification voltage PVR will not receive the precharge voltage during the second verifying step. Accordingly, the ON-cell current decreases during the second verifying step in relation to the number of memory cells designated as slow. This decrease in ON-cell current also decreases the common source line voltage $V_{CSL}$ proportionally.

Figure 8A:
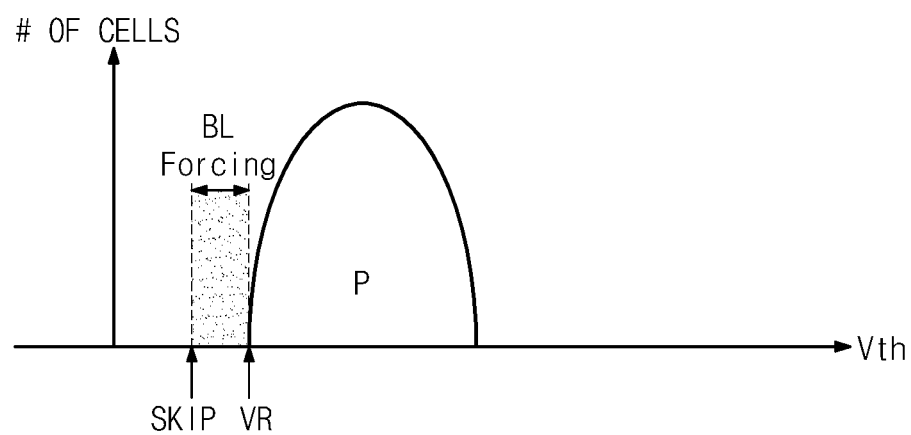
FIG. 8, inclusive of FIGS. 8A and 8B, conceptually illustrates a single step verification mode for a nonvolatile memory cell according to embodiments of the inventive concept.
Figure 8B:
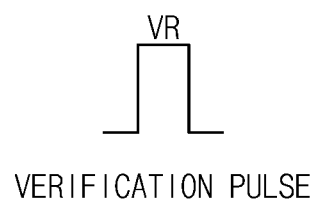

In contrast to the multiple-step verification mode illustrated in FIG. 4, FIG. 8, inclusive of FIGS. 8A and 8B, illustrates a single-step verification mode susceptible to incorporation within certain embodiments of the inventive concept.

Referring to FIG. 8, only a single verification step may be performed to determine whether the post-programming threshold voltage of selected memory cell(s) falls within a target threshold voltage distribution P. Here again, it is assumed that a precharge voltage is applied to a selected word line during the verification operation. The waveform of FIG. 8B illustrates one possible example of a verification pulse having a predetermined period and level defined by a single verification voltage VR.

Since the 1-step verification mode only includes a single verification step, its execution time is reduced over multiple-step verification modes, such as the one described in FIG. 4. In the embodiment of FIG. 8 as compared with the embodiment of FIG. 4, the first verification step formerly performed in relation to the pre-verification voltage PVR is omitted or skipped (SKIP).

It should be noted, however, that even where a single-step verification mode is selected for use during a verification operation, bit line forcing may still be used as part of the programming operation. However, the identification of slow verses fast memory cells within a group of selected memory cells must therefore be made outside the verification operation. For example, a one-time or an iteratively repeated pre-verification operation may be used before a programming interval. Otherwise, a determination to use either bit line forcing or normal programming control voltages may be similar to the embodiments described in relation to FIGS. 2, 3 and 4.

Accordingly, and as described in relation to the embodiments illustrated in FIGS. 2 through 7, methods of operating a memory system according to embodiments of the inventive concept may control the number of ON/OFF memory cells during a verification operation (or verification step) using different schemes, and in relation to different verification modes.

Where, for example, an iteratively executed pre-verification operation is used in conjunction with a determined verification mode, memory cells designated as slow (e.g., not-passed or having a threshold voltage outside the proximate threshold voltage range) will not receive bit line forcing during a next programming interval. On the other hand, memory cells designated as fast (e.g., passed or having a threshold voltage within the proximate threshold voltage range) will receive bit line forcing during the next programming interval. Those skilled in the art will recognize that various types of per-verification operations may be performed within the overall operation of a nonvolatile memory system in relation to the programming of selected memory cells (e.g., before a first programming interval, before each programming interval, following a first verification operation, following each verification operation, etc.).

Figure 9:
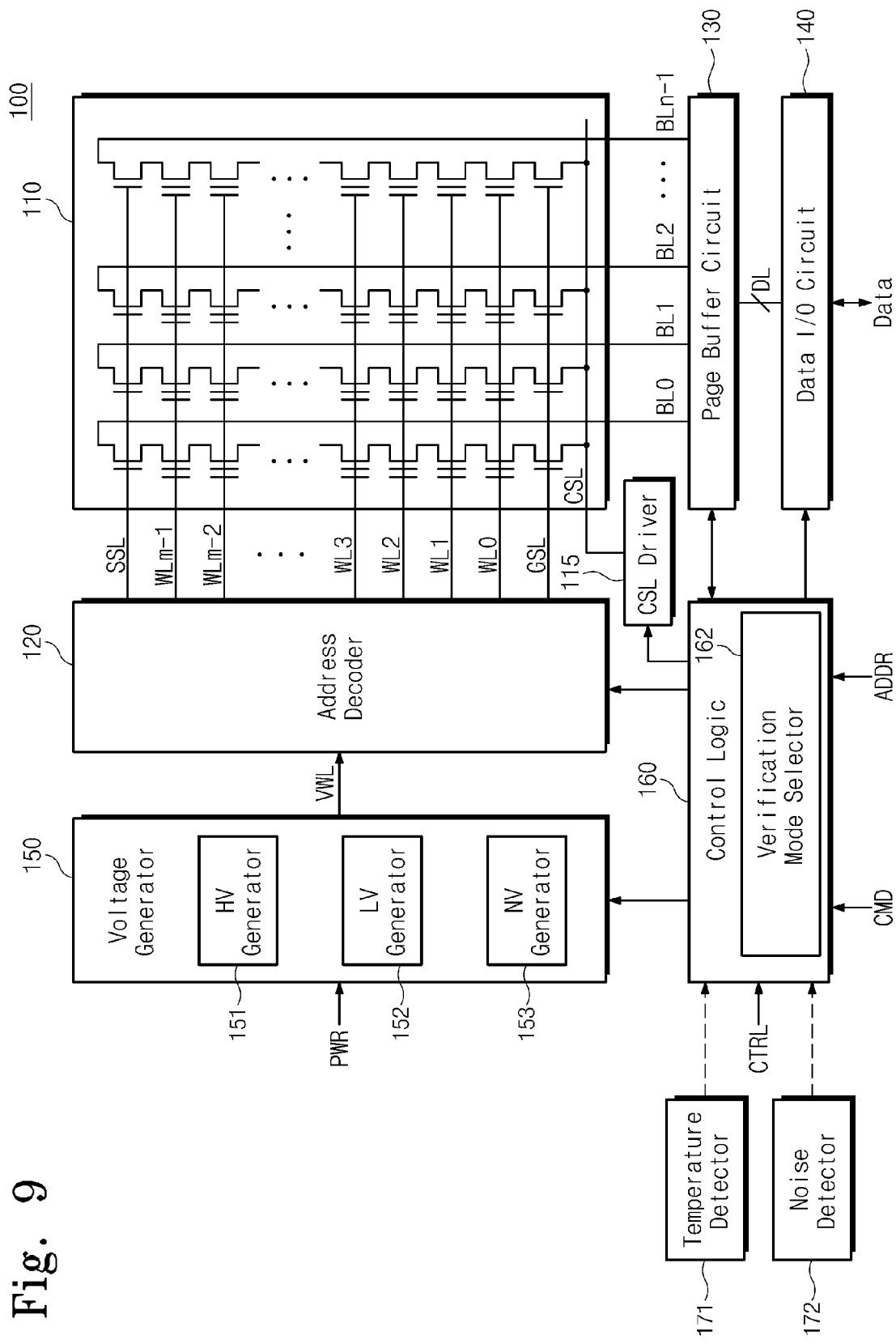
FIG. 9 is a partial block diagram of an exemplary nonvolatile memory device according to embodiments of the inventive concept.

FIG. 9 is a block level diagram illustrating one possible example of a nonvolatile memory device according to an embodiment of the inventive concept.

Referring to FIG. 9, a nonvolatile memory device 100 comprises in relevant portion; a memory cell array 110, an address decoder 120, a page buffer circuit 130, a data input/output circuit 140, a voltage generator 150, and a control logic 160. Temperature detector 171 and/or noise detector 172 are shown optionally connected to control logic 160 for certain related embodiments of the inventive concept.

The memory cell array 110 may be configured with a plurality of memory blocks, but only one memory block is illustrated in FIG. 9 for the sake of clarity. Each memory block may be configured with a plurality of physical pages. Each physical page may include a sequence of memory cells connected to a common word line. Each memory cell in the memory cell array 110 may be configured to store a single bit of data (hereafter, a single level cell, SLC) or two or more bits of data (hereafter, a multi level cell, MLC).

In one more particular embodiment of the invention, the memory cell array substantially comprises 2-bit MLC flash arranged in two logical pages per physical page. As is understood by those skilled in the art, a logical page may be defined in as a collection of data capable of being simultaneously programmed to one physical page. In another embodiment of the inventive concept, the memory cell array substantially comprises 3-bit MLC flash arranged in three logical pages per physical page.

Consistent with the working assumption that the memory cell array 110 implements a flash memory device, the constituent memory cells may be configured in a plurality of cell strings. Each of the cells strings comprises a string selection transistor connected to a string selection line SSL, a plurality of memory cells respectively connected to a plurality of word lines $WL_0$ to $WL_{m-1}$, and a ground selection transistor connected to a ground selection line GSL. The string selection transistor is connected to a bit line BL, and the ground selection transistor is connected to a common source line CSL. The common source line CSL may receive a ground voltage or a CSL voltage (e.g., VDD) from a CSL driver 115.

Again referring to FIG. 9, the address decoder 120 is connected to the memory cell array 110 through the selection lines SSL and GSL and the word lines $WL_0$ to $WL_{m-1}$. During a programming operation or read operation, the address decoder 120 receives an address signal ADDR through control logic 160 and selects at least one word line.

The page buffer circuit 130 is connected to the memory cell array 110 through bit lines BL0 to $BL_{n-1}$. The page buffer circuit 130 is typically configured with a plurality of page buffers (not shown). Each bit line may be respectively connected to each page buffer in a so-called "all BL structure", or two or more bit lines may be connected to a page buffer in a so-called "shielded BL structure". The page buffer circuit 130 may be sued to temporarily store "program data" to be programmed in a selected page during a programming operation and/or "read data" retrieved from the memory cell array 110 during a read operation directed to a selected page.

The data input/output (I/O) circuit 140 is internally configured between the page buffer circuit 130 and externally connected I/O lines (Data). The data I/O circuit 140 receives program data from an external device (e.g., a memory controller) via the I/O lines and then applies received program data DL to the page buffer circuit 130. Conversely, the data I/O circuit 140 receives read data DL from the page buffer circuit 130 and provides it to an external device via the data I/O lines.

The voltage generator 150 receives an externally provided power voltage (PWR) and generates the control voltages (e.g., a word line voltage VWL) necessary for programming and reading data from the memory cell array 110. Under the timing control of the control logic 160, the voltage generator 150 generates and provides various control voltages, such as the word line voltage VWL to the address decoder 120. In the illustrated example of FIG. 9, the voltage generator 150 comprises a high voltage generator 151, a low voltage generator 152, and a negative voltage generator 153.

Each of these particular generators may be used to generate a range of control signal voltages. For example, the high voltage generator 151 may generate a high voltage HV greater than a externally provided power source voltage. The high voltage may be used as a program voltage Vpgm or a pass voltage Vpass. The low voltage generator 152 may generate a low voltage LV less than or equal to the power source voltage. The power source voltage or the low voltage may be used as a bit line precharge voltage or a CSL voltage. The negative voltage generator 153 may generate a negative voltage NV less than 0V. The negative voltage may be used as a verification voltage.

As is conventionally appreciated, the control logic 160 essentially controls the respective and/or collective circuit functionally of the other components making up the nonvolatile memory device 100. By means of various protocol-defined commands CMD and related control signal(s) CTRL, the control logic directs the execution of programming, read and erase operations, along with related memory device maintenance operations. For example, during a programming operation, the control logic 160 enables the timely application certain control voltage(s) to a selected word line by controlling the address decoder 120, and further enables the storage of program data for a selected page by controlling the page buffer circuit 130 and the data I/O circuit 140.

During a programming operation consistent with embodiments of the inventive concept, the control logic 160 selectively enables the application of control voltages defining a bit line forcing scheme for memory cells designated as fast, and the application of control voltages defining a normal programming scheme for memory cells designated as slow.

That is, the control logic 160 may cause the generation and application of the bit line forcing voltage BLFV to bit lines connected to fast memory cells or the generation and application of the bit line programming voltage BLPV to bit lines connected to slow memory cells. This distinct control voltage treatment may result from slow/fast memory cell designation data derived during a preceding verification operation and/or during a pre-verification operation, where the slow/fast memory cell designation data is stored in a memory, register, or latch associated with the control logic 160 or associated with the corresponding page buffers within the page buffer control circuit 130.

In one more particular embodiment of the inventive concept, the control logic 160 comprises a verification mode selector 162 configured to select a verification mode from a plurality of possible verification modes that will be used in a next verification operation. As noted above, the verification mode selection made by the verification mode selector 162 may be made in response to an evaluation of one or more programming condition(s). Hereafter, "a programming condition" will be referred to in the singular for the sake of descriptive simplicity, but those of ordinary skill in the art will recognize that multiple programming conditions may be independently or conditionally (e.g., in cascade) evaluated in selecting an appropriate verification mode. Further, exemplary embodiments of the inventive concept will be described hereafter under a simplifying assumption that the plurality of verification modes includes only a 1-step verification mode and a 2-step verification mode. Those skilled in the art will recognize that any number of reasonably defined verification modes may be included in a defined plurality of verification modes consistent with embodiments of the inventive concept. However, rather than dwell on a lengthy listing of conventionally understood verification modes that might be used in a particular memory system, the simple choice, as implemented by the control logic 160, between a 1-step verification mode and a 2-step verification mode will be used as a general example. Naturally, the choice between verification modes included in a plurality of verification modes is a matter of design choice made in view of the type(s) of memory cells forming memory cell array 110, current data state(s) for the memory cells, data access speed(s) being demanded by a host incorporating the nonvolatile memory device, operating life of the memory cells, and the operating environment (e.g., temperature, voltage, number of operation loops, etc.) for the nonvolatile memory device to name but a few. Such considerations will also drive the identification and use of various programming condition(s) to be evaluated in ultimately making the verification mode selection.

In one embodiment of the inventive concept consistent with the illustrated example of FIG. 9, the verification mode selector 162 selects between the 1-step and 2-step verification modes by counting (e.g., one example of evaluating a programming condition) a number of executed programming intervals or programming loops (e.g., one example of a programming condition) during a current programming operation. For example, a "programming interval threshold" may be stored as a value within a register or memory associated with the verification mode selector 162. So long as the number of executed programming intervals remains less than the programming interval threshold, the verification mode selector 162 selects the 2-step verification mode for use during the next verification operation. On the other hand, when the number of executed programming interval reaches the programming verification threshold, the verification mode selector 162 selects the 1-step verification mode for use during the next verification operation.

Given the inherent tendency of contemporary flash memory cells to wear out under the stress of repeatedly applied operations (programming, read and erase) and the demand for greater data access speed, the number of executed programming intervals per programming operation is a important memory system consideration. As has been described above, the conditional use (e.g., fast MLC verses slow MLC designation) of bit line forcing and normal programming may be expected to reduce the overall number of executed programming intervals. That is, the nonvolatile memory device 100 of FIG. 9 incorporating selective bit line forcing may initially perform verification operation(s) using the 2-step verification mode until the number of executed programming intervals reaches the programming interval threshold at which point in time the verification operation(s) continue using the 1-step verification mode. This approach not only tends to reduce the overall number of executed programming intervals, but also tends to reduce the overall time required to program the selected memory cells. Of note, the selective switching between verification modes is performed dynamically—or during the overall programming operation. By way of comparison, the verification mode used during conventional programming operations can not be changed within the unitary programming operation on the basis of an evaluated programming condition.

Figure 10:
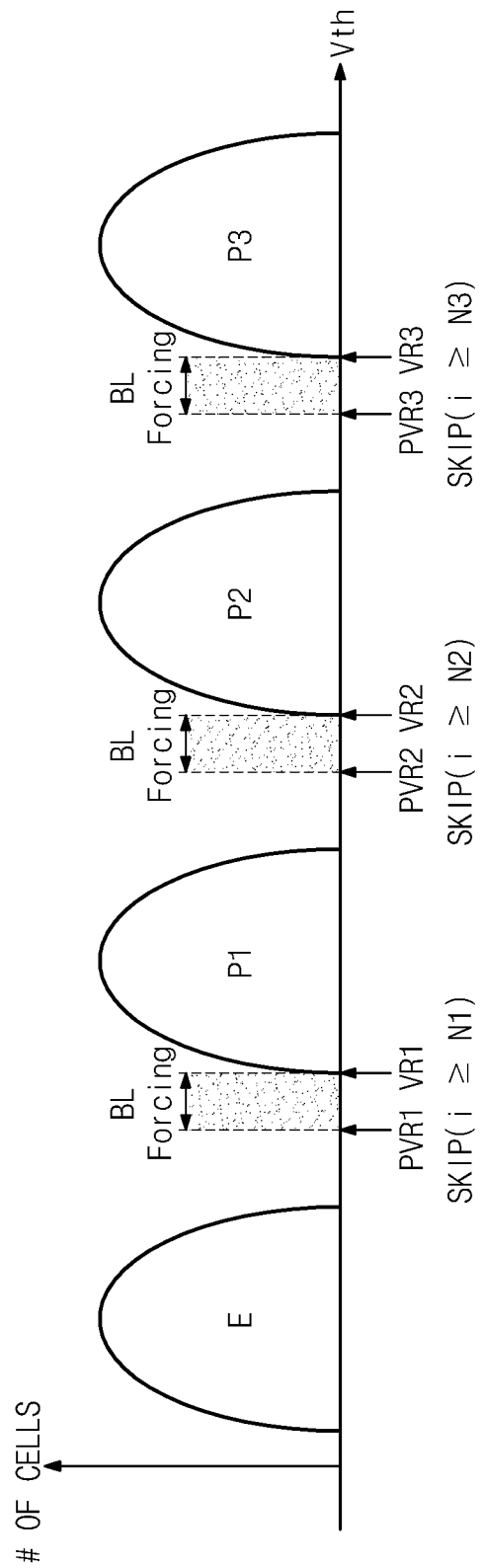
FIG. 10 is a conceptual diagram illustrating a threshold voltage distribution for an exemplary 2-bit MLC, as programmed according to certain methods of operating nonvolatile memory devices and/or memory systems consistent with embodiments of the inventive concept.

FIG. 10 illustrates four (4) threshold voltage distributions associated with an exemplary 2-bit MLC. An erase state (E) and first through third programming states (P1, P2 and P3) for the nonvolatile memory cell are indicted by a respective and corresponding threshold voltage distributions. However, FIG. 10 further illustrates the selective verification mode feature of FIG. 9 in relation to an assumed programming operation capable of selectively using bit line forcing.

The verification operation for each one of the three (3) programming states P1, P2 and P3 may be performed using either the 1-step verification mode or the 2-step verification mode, as selected on the basis of a counted number of executed programming intervals. In the illustrated embodiment of FIG. 10 it is further assumed that a current programming interval ("i") is less than each of three (3) programming interval thresholds N1, N2, and N3 (e.g., positive integers greater than 1 and having equal or different value(s)) respectively associated with programming states P1, P2 and P3. Accordingly, the current (ith) verification operation associated with the ith programming interval uses the 2-step verification mode.

Consistent with the description associated with FIG. 2, the ith verification operation for the first programming state P1 is performed using the 2-step verification mode which includes a first verifying step executed in relation to a first pre-verification voltage PVR1 and a second verifying step executed in relation to a first verification voltage VR1. The ith verification operation for the second programming state P2 is performed using the 2-step verification mode which includes a first verifying step executed in relation to a second pre-verification voltage PVR2 and a second verifying step executed in relation to a second verification voltage VR2, and the ith verification operation for the third programming state P3 is performed using the 2-step verification mode which includes a first verifying step executed in relation to a third pre-verification voltage PVR3 and a second verifying step executed in relation to a third verification voltage VR3.

For each programming state P1, P2 and P3 and as a result of each corresponding first verifying step of the 2-step verification mode, a memory cell undergoing programming (i.e., a memory cell residing outside of the intended target threshold voltage distribution P) and having a threshold voltage less than the respective pre-verification voltage PVR will not receive bit line forcing control voltages, and may coincidentally be identified as a slow memory cell for a next programming interval. In contrast, for each programming state P1, P2 and P3 and as a result of each corresponding first verifying step, the memory cell undergoing programming and having a threshold voltage greater than or equal to the respective pre-verification voltage PVR but less than the corresponding verification voltage VR will receive bit line forcing control voltages and may coincidentally be identified as a fast memory cell.

In this manner, the respective pre-verification voltages (PVR1, PVR2, PVR3) act as pass/not-pass thresholds identifying "pass" memory cells having a threshold voltage residing within the proximate threshold voltage range (e.g., the shaded region of FIG. 10) from "not-pass" memory cells having a threshold voltage residing in the distant threshold voltage range. The control voltage treatment of pass and not-pass memory cells is different (e.g., bit line forcing or normal programming). The 2-step verification mode continues in each verification operation until such time as the number of executed programming intervals reaches a defined programming interval threshold (e.g., $i \geq N1$, N2 or N3).

When the number of executed programming intervals reaches a defined programming interval threshold (e.g., $i \geq N1$, N2 or N3), the method of operating a memory device according to certain embodiments of the inventive concept selects the 1-step verification mode for each one of the programming states P1, P2 and P3. The exemplary 1-step verification mode omits (SKIP) the first verifying step associated with the respective pre-verification voltages (PVR1, PVR2, PVR3) to perform a single verifying step performed in relation to the respective verification voltages (VR1, VR2, VR3).

As previously noted, a determination to use bit line forcing on a particular memory cell during a current (or next) programming interval may be made independent from a selection of verification mode. Thus, selective bit line forcing may used regardless of whether a 2-step verification mode or a 1-step verification mode is being used. For example, the last-stored slow/fast memory cell designation data derived during a previously performed 2-step verification mode may be retained and used during a later performed 1-step verification mode. Alternately, a pre-verification step identifying slow/fast memory cells may be performed outside the selected verification mode.

Figure 11:
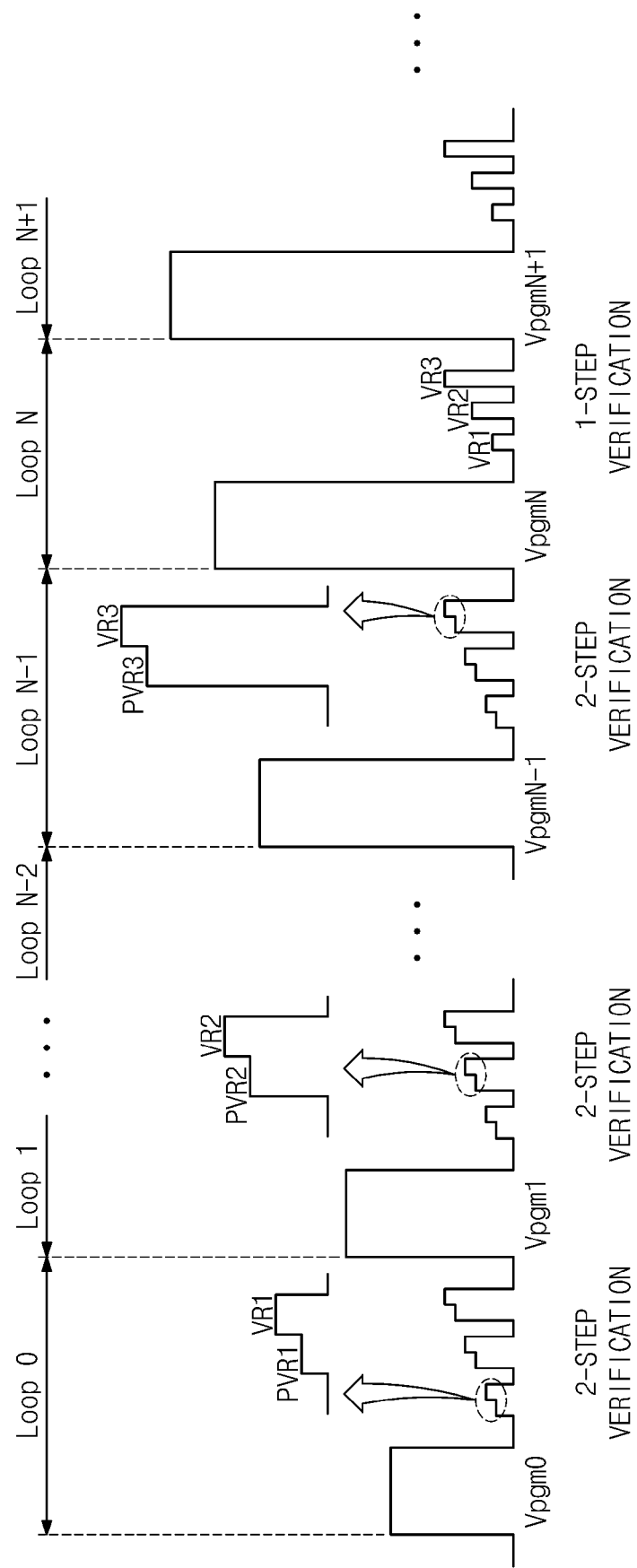
FIG. 11 is a waveform diagram further illustrating a series of programming/verification pulses applied to nonvolatile memory cells according to embodiments of the inventive concept.

Consistent with the description given above in relation to FIGS. 9 and 10, FIG. 11 is a diagram conceptually illustrating the application of a sequence of ISPP-defined programming voltages ($V_{pgm0}$-$V_{pgmN+1}$) and corresponding verification voltages over a number of programming intervals N+1 according to certain embodiments of the inventive concept.

Referring to FIG. 11, increasing ($\Delta$ISPP) programming voltages $V_{pgm0}$-$V_{pgmN+1}$ are applied over programming intervals (loops) 0 through N+1. A 2-step verification mode is initially used during programming interval 0 and continues until programming interval N−1. However, the Nth programming interval exceeds a programming interval threshold commonly defined for all three (3) programming states P1, P2 and P3 (i.e., N1=N2=N3=N). Thus, following the application of the Nth programming voltage $V_{pgmN}$ the control logic 160 of the memory device 100 selects the 1-step verification mode which continues in use until the selected memory cell(s) are properly programmed or a maximum number of programming intervals is exceeded. As noted in relation to FIGS. 4, 8 and 10, each verification voltage applied during the 2-step verification mode is a compound pulse formed by a pre-verification pulse PVR# followed by a verification pulse VR#, whereas each verification voltage applied during the 1-step verification mode is simply a verification voltage pulse VR#, where # is a number corresponding to each programming state.

Accordingly, in the illustrated example of FIG. 11, each cycle of the 2-step verification mode performed during programming intervals 0 through N−1 comprises the generation and application of six (6) verification voltage pulses (2 per programming state). In contrast, each cycle of the 1-step verification mode performed during programming intervals N onward comprises the generation and application of three (3) verification voltage pulses (1 per programming state). Those of ordinary skill in the art will recognize that as the number of MLC programming states increases (e.g., from 2 to 3 to 4 . . . ), the time and overhead (read verify operations, PASS/FAIL checks, etc.) required to execute a multiple-step verification mode rises markedly. Thus, looking forward to MLCs practically enabling the storage of 3 or more bits of data, the dynamic capability afforded by embodiments of the inventive concept to select between single-step verses multiple-step verification modes will provide memory devices and incorporating memory systems with an expanded ability to program MLC data using fewer programming intervals and yet with highly controllable programming accuracy.

Figure 12:
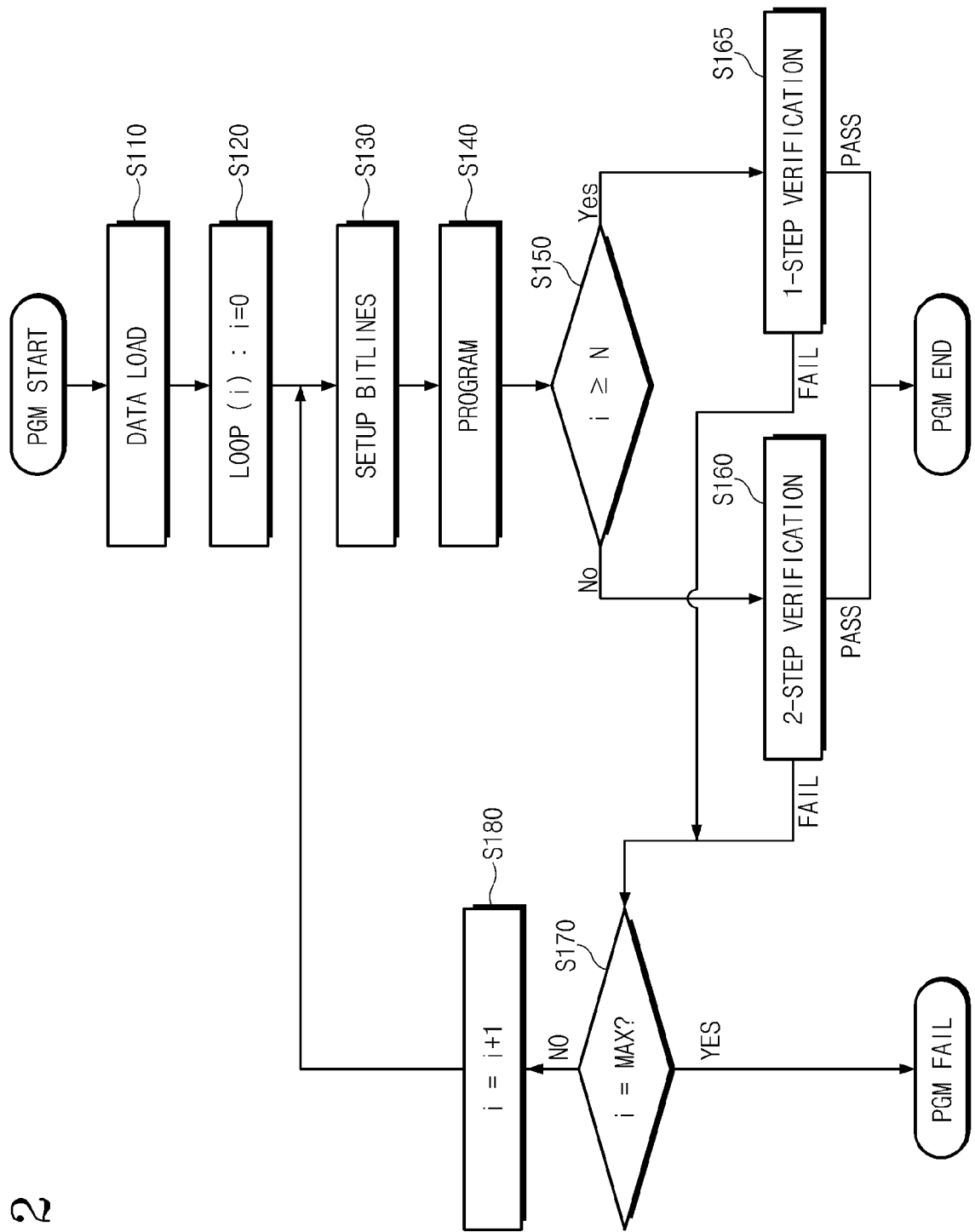
FIG. 12 is a flowchart summarizing in relevant portion a method of operating (including a method of programming) a nonvolatile memory and/or memory system according to embodiments of the inventive concept.

FIG. 12 is a flowchart summarizing in relevant portion a method of operating a nonvolatile memory device such as the memory device 100 in FIG. 9 according to an embodiment of the inventive concept.

Referring collectively to FIGS. 9 through 12, the method of operating includes a method of programming nonvolatile memory cells within the nonvolatile memory device 100 according to embodiments of the inventive concept.

Program data received with a corresponding program command CMD is loaded to the page buffer circuit 130 through the data I/O circuit 140 (S110). In response to control signals CTRL generated by the control logic 160 in response to the program command CMD, the voltage generator 150 generates certain control voltages (e.g., bias voltage, program voltage, pass voltage, high voltage, well voltage, verification voltage, read voltage, etc.) that are necessary to the programming operation. Once the required control voltages and corresponding control signals are stably provided by the voltage generator 150, the control logic 160 causes the execution of a first programming loop (Loop 0) during a first programming interval (i=0) (S120).

The bit lines $BL_0$ to $BL_{n-1}$ of the memory cell array 110 are set up in response to respective data values included in the program data loaded to the page buffer circuit 130 (S130). Subsequently, a pass voltage $V_{pass}$ is applied to unselected word lines and a program voltage $V_{pgm}$ is applied to a selected word line to program selected memory cell(s) (S140). For example, the control logic 160 may control the operation of the page buffer circuit 130 and voltage generator 150 such that the bit line forcing voltage BLFV (e.g., 1.0V) is applied to bit lines connected to memory cells identified as fast. Further, the control logic 160 may control the operation of the page buffer circuit 130 and voltage generator 150 such that bit line forcing voltage BLFV is not to be applied to slow memory cells. Instead a bit line program voltage BLPV (e.g., 0.0V) will be applied to bit lines connected to slow memory cells.

An initial identification of slow/fast memory cells may be made during a pre-verification operation performed outside the programming operation, or as part of a manufacturer's test generating initial slow/fast memory cell designation data. Alternately, all selected memory cells may be initially programmed (S140 for i=0) as either slow or fast memory cells prior to a first verification operation.

Following each successive program step (S140), the method evaluates a programming condition and on the basis of the evaluated programming condition selects a verification mode to be used during a next verification operation. In the illustrated example shown in FIG. 12, the previous working example is again assumed. Therefore, the exemplary evaluation of a programming condition comprises determining whether the current programming loop "i" is greater than or equal to a predetermined programming interval threshold "N" (S150). If not, the 2-step verification mode is selected (S150=NO), otherwise the 1-step verification mode is selected (S150=YES). That is, in the example of FIG. 12, the selection of a verification mode on the basis of the programming condition comprises a simple selection between a single-step and a multiple-step verification mode.

The selective execution of the 2-step verification mode (S160) or the 1-step verification mode (S165) in relation to each selected memory cell yields one of two results. Either the selected memory cell is PASS, (i.e., properly programmed to a defined threshold voltage distribution—e.g., P1, P2, P3), or FAIL (i.e., not properly programmed to the defined threshold voltage distribution—e.g., P1, P2, P3). A PASS status terminate the programming operation in relation to the selected memory cell. A FAIL status invokes a next programming loop.

The next programming loop in the example of FIG. 12 is begun by first comparing the current programming interval "i" with a defined maximum number of programming intervals (MAX) (S170). If "I" reaches MAX, the programming operation terminates in a failure (or error) condition. Otherwise, the current programming interval count "i" is incremented by 1 (S180), and the programming operation cycles to the beginning of a next program loop.

In this regard and as is conventionally understood, a pass voltage may be applied to the selected word line before the program voltage is applied (S140). Following the application of the program voltage, the program step (S140) may also comprise a so-called program recover operation. In the program recover operation, bias voltages are applied to the word lines $WL_0$ to $WL_{m-1}$, the string selection line SSL is discharged, and voltages applied to the bit lines $BL_0$ to $BL_{n-1}$ are discharged.

As noted above, the exemplary evaluation of a programming condition (i.e., the comparison of a current programming interval "i" to a programming interval threshold "N") may be made in the control logic 160 using (e.g.,) a counter/comparator circuit and a register or latch storing the programming interval threshold (S150). Various and potentially different programming interval thresholds may be respectively established for each programming state (e.g., P1, P2, P3).

The foregoing examples have been specifically drawn to nonvolatile memory devices incorporating MLCs storing 2 bits of data per memory cell. However, these teachings may be readily extended to MLCs storing 3 or more bits of data per memory cell. For example, FIG. 13, inclusive of diagrams 13A, 13B and 13C, conceptually illustrates an embodiment of the inventive concept as applied to a 3-bit MLC storing 3 logical pages of data per each physical page.

FIG. 13A illustrates a first programming stage directed to the first logical page associated with a least significant bit (LSB). Each LSB is programmed between an erase state (E) and one (1) first level intermediate programming state (P). Thus, programming efficiency between these two states may well dictate the use of a 1-step verification mode. In other words, the particular MLC data bit being programmed may be used as a programming condition to select a particular verification mode.

FIG. 13B illustrates a second programming stage directed to the second logical page associated with a next most (i.e., the $2^{nd}$ bit of the 3-bit data) significant bit (NSB). Each NSB is programmed between the erase state (E) and three (3) second level intermediate programming states (P1, P2, P3). The second programming stage may use, for example, an approach such as the one described in relation to FIG. 10. That is, a pre-verification voltage PVR# and a verification voltage VR# may be defined in relation to each one of the three (3) second level intermediate programming states (P1, P2, P3). Using these voltages, a 2-step verification mode is initially used until an executed number of programming intervals "i" reaches respective programming interval thresholds (N1, N2, N3) associated with the three (3) second level intermediate programming states (P1, P2. P3) at which time a 1-step verification mode may be selected.

FIG. 13C illustrates a third programming stage directed to the third logical page associated with a most significant bit (MSB). Each MSB is programmed between the erase state (E) and seven (7) (final) programming states (Q1-Q7). The third programming stage may use an approach similar to that described in relation to FIG. 10, except the number of programming states is increase from 3 to 7. Nonetheless, a pre-verification voltage PVR# and a verification voltage VR# may be defined in relation to each one of the seven (7) programming states (Q1-Q7). Using these voltages, a 2-step verification mode may again be initially used until an executed number of programming intervals "i" reaches respective programming interval thresholds (M1-M7) associated with the seven (7) programming states (Q1-Q7) at which time a 1-step verification mode may be selected. As with the intermediate-state programming interval thresholds (N1, N2, N3), the final-state programming interval thresholds (M1-M7) may all have the same integer value or one or more of the programming interval threshold values may be different from the others, according to design requirements.

Figure 13:
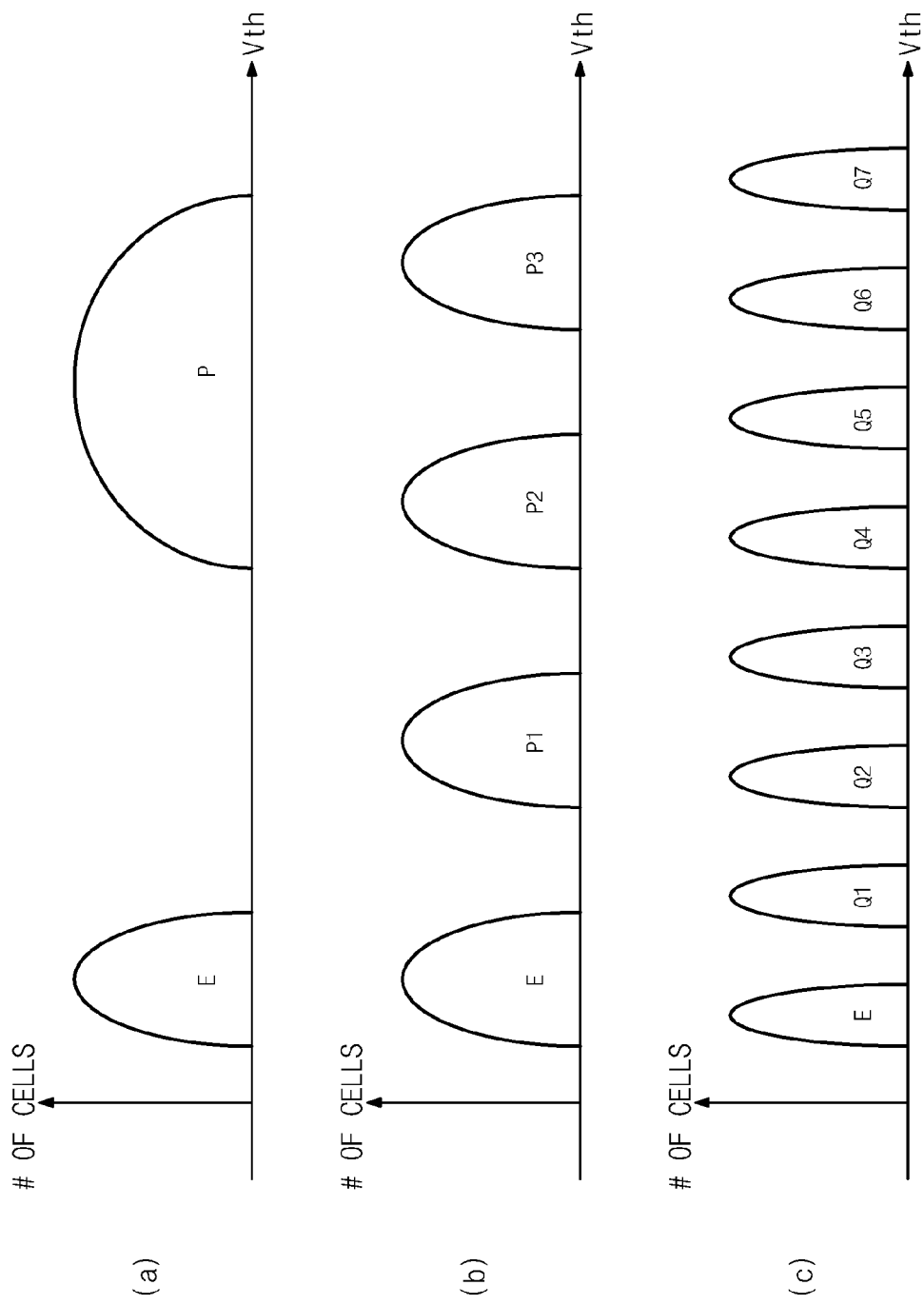
FIG. 13, inclusive of diagrams 13A, 13B and 13C, is a diagram illustrating threshold voltage distributions for an exemplary 3-bit MLC susceptible to being programmed according to embodiments of the inventive concept.

Although not shown in FIG. 13, those of ordinary skill in the art will recognize that fourth and higher logical pages may be similarly programmed in corresponding programming stages to MLCs having an ability to store 4-bit and higher data.

It should be reiterated at this point that the embodiments previously described in relation to FIGS. 9 through 13 have all been drawn to a programming condition defined by a number of executed programming intervals and a selection between verification modes differing by a number of constituent verification steps. However, the scope of the inventive concept is not limited to only this type of programming condition (and its evaluation), and/or only these types of verification modes. Other possible programming conditions and verification modes have been suggested above, and those skilled in the art will understand the a choice of programming condition, its evaluation approach, and possible types of verification modes that may be selected in view of same will very my design and application.

Figure 14:
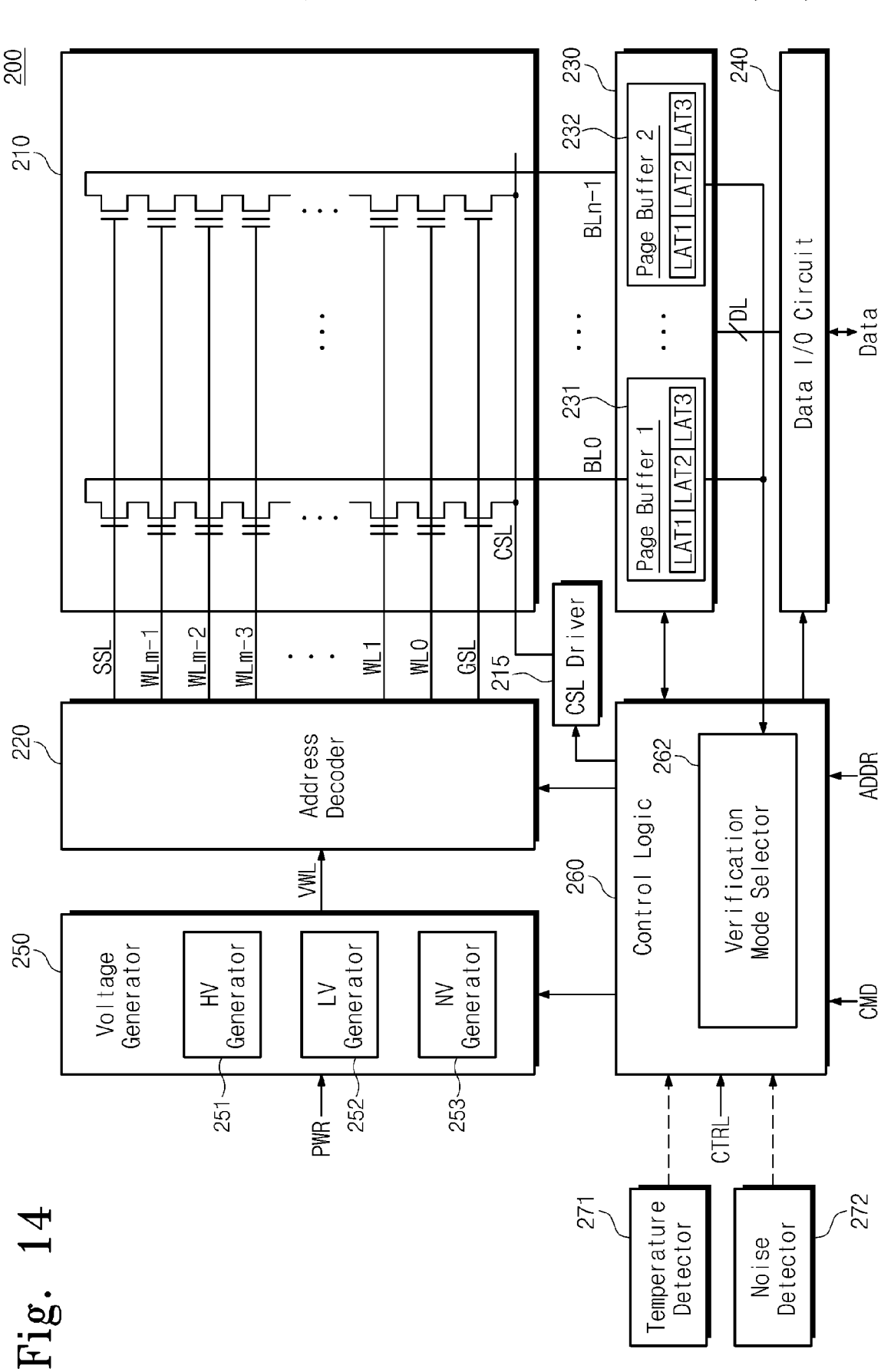
FIG. 14 is a partial block diagram of an exemplary nonvolatile memory device according to embodiments of the inventive concept.

FIG. 14 is a block level diagram illustrating another possible example of a nonvolatile memory device according to an embodiment of the inventive concept. The nonvolatile memory device 200 of FIG. 13 comprises a memory cell array 210, an address decoder 220, a page buffer circuit 230, a data input/output circuit 240, a voltage generator 250, and a control logic 260. The nonvolatile memory device 200, similar to the embodiment of the inventive concept described in relation to FIG. 9, may optionally include a temperature sensor 271 and/or a noise detector 272 connected to the control logic 260. These components are configured and operate in a manner similar to corresponding elements previously described in relation the embodiment of FIG. 9. However, the structure and function of the page buffer circuit 230 is described in some additional detail with respect to FIG. 14.

As before, the page buffer circuit 230 is connected to the memory cell array 210 through respective bit lines BL0 to $BL_{n-1}$. As before, the page buffer circuit 230 is used to temporarily store program data and read data.

More particularly, the page buffer circuit 230 comprises a plurality of page buffers 231 and 232. Each one of the page buffers 231 and 232 comprises first, second and third latches (LAT1, LAT2, LAT3). Assuming the incorporation of 2-bit MLCs in the memory cell array 210, the first latch LAT1 may be configured to store the LSB of the program (or read) data, and the second latch LAT2 may be configured to store the MSB. The third latch LAT3 may be configured to store slow/fast memory cell designation data, such as may be used to indicate the use (or not) of bit line forcing.

The term "memory cell designation data" is a broad term and denotes any data (or information) identifying the relative programming state, threshold voltage status, or program-ability between nonvolatile memory cells in a memory cell array. The relative designations "slow" and "fast" have been used above in relation to threshold voltages residing in a defined proximate threshold voltage range or distant threshold voltage range. Similar designations might be made for memory cells exhibiting different programming speeds (e.g., the rapidity with which a threshold voltage moves in response to the application of certain control voltages), or different susceptibility to programming caused by different levels of wear. From the foregoing description and examples set forth herein, those skilled in the art will understand that various forms of memory cell designation data indicating various forms of programming conditions may be defined and used to facilitate the dynamic selection of verification modes within embodiments of the inventive concept.

Returning to FIG. 14, the third latch LAT3 is configured to store memory cell designation data as defined by (e.g.,) a pre-verification operation result or a verification operation. Consistent with the working example of FIG. 10, the third latch LAT3 may store a data value of 0 to indicate a fast memory cell to be programmed using bit line forcing, or a data value of 1 to indicate a slow memory cell to be programmed using normal programming. In certain embodiments of the inventive concept, the memory cell designation data may be derived in relation to a comparison between the current threshold voltage of selected memory cell(s) and a pre-verification and a verification voltage for a particular programming state.

Accordingly, the control logic 260 may control the programming, read and erase operations for the nonvolatile memory device 200 in response to an externally provided command CMD and/or control signal(s) CTRL. The control logic 260 causes the execution of bit line forcing for fast memory cells or normal programming from slow memory cells during a current programming interval on the basis of the memory cell designation data stored in the third latch LAT3.

Moreover, the control logic 260 may evaluate one or more programming condition(s) using the verification mode selector 262 in accordance with the memory cell designation data stored in the third latch LAT3. That is, certain programming conditions may be evaluated, wholly or in part, on the basis of stored memory cell designation data. For example, the verification mode selector 262 might determine whether a certain programming state is "passed" by evaluating the data stored in the first, second and third latches LAT1 to LAT3 of each one of the plurality of page buffers 231 and 232 during a programming operation.

It should be noted that the verification mode selector 262 illustrated in FIG. 14 is configured within the control logic 260. However, this need not always be the case, and a separate verification mode selector 262 might be provided outside the control logic 260, such as within the page buffer 230 or a circuit associated with the page buffer circuit.

Of note, certain embodiments of the inventive concept may use memory cell designation data that includes program state data indicating whether or note a particular programming state exists for one or more bits of program data. Programming state for one or more bits of program data may thus be used as a type of programming condition that may be evaluated to select a particular verification mode.

Figure 15:
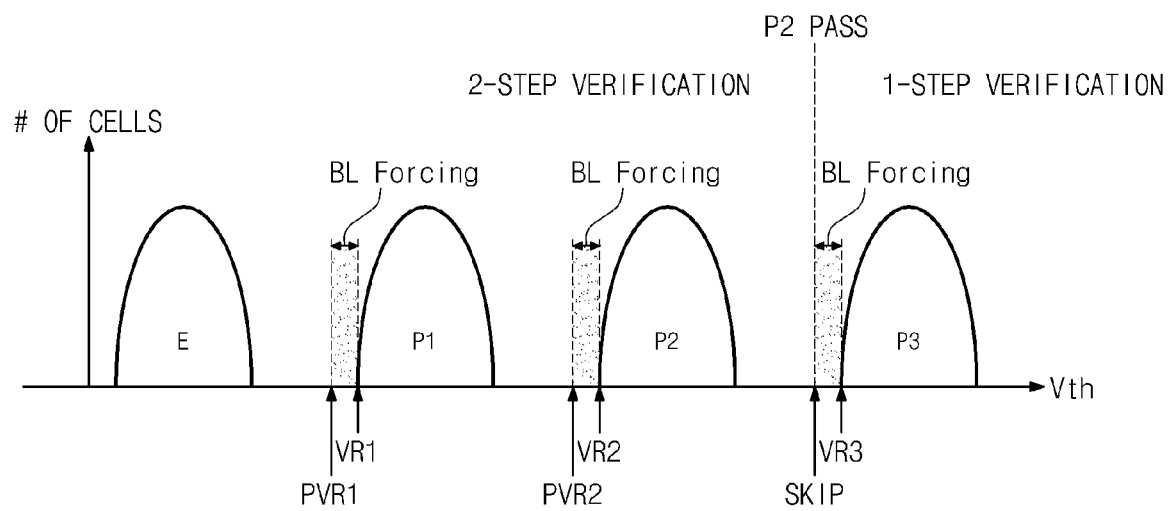
FIG. 15 is a conceptual diagram illustrating a threshold voltage distribution for an exemplary 2-bit MLC, as programmed according to certain methods of operating nonvolatile memory devices and/or memory systems consistent with embodiments of the inventive concept.

FIG. 15 is a diagram illustrating an embodiment of a threshold voltage distribution for an exemplary 2-bit MLC in relation to a programming operation for a nonvolatile memory device, such as the nonvolatile memory device 200 of FIG. 14.

Referring to FIG. 15, an erase state (E) and three (3) programming states (P1, P2, P3) are again illustrated. It is assumed for purposes of this illustration that either a 1-step verification mode or a 2-step verification mode may be selected during a programming operation. However, instead of being selected on the basis of a slow/fast designation each verification mode is selected on the basis of current programming state for the selected memory cell(s).

Thus, in the illustrated embodiment of FIG. 15, a selected memory cell being programmed to the first or second programming states P1, P2 will is verified during a subsequent verification operation in relation using the 2-step verification mode in relation to pre-verification voltages PVR# and verification voltages VR#, as previously described. However, a selected memory cell being programmed to the third programming states P3 will is verified during a subsequent verification operation using the 1-step verification mode in relation to verification voltages VR3. In certain related embodiments, this particular programming condition (i.e., programming to a third (or highest) programming state) may be evaluated by comparing the threshold voltage of the selected memory cell to a pass threshold voltage (P2 in the illustrated example of FIG. 15). Once the threshold voltage for the selected memory cell reaches this pass threshold, a 1-step verification mode is selected. Of further note, bit line forcing is selectively enabled/disabled for the selected memory cells of the embodiment of FIG. 15 in a manner similar to those preciously described.

Figure 16:
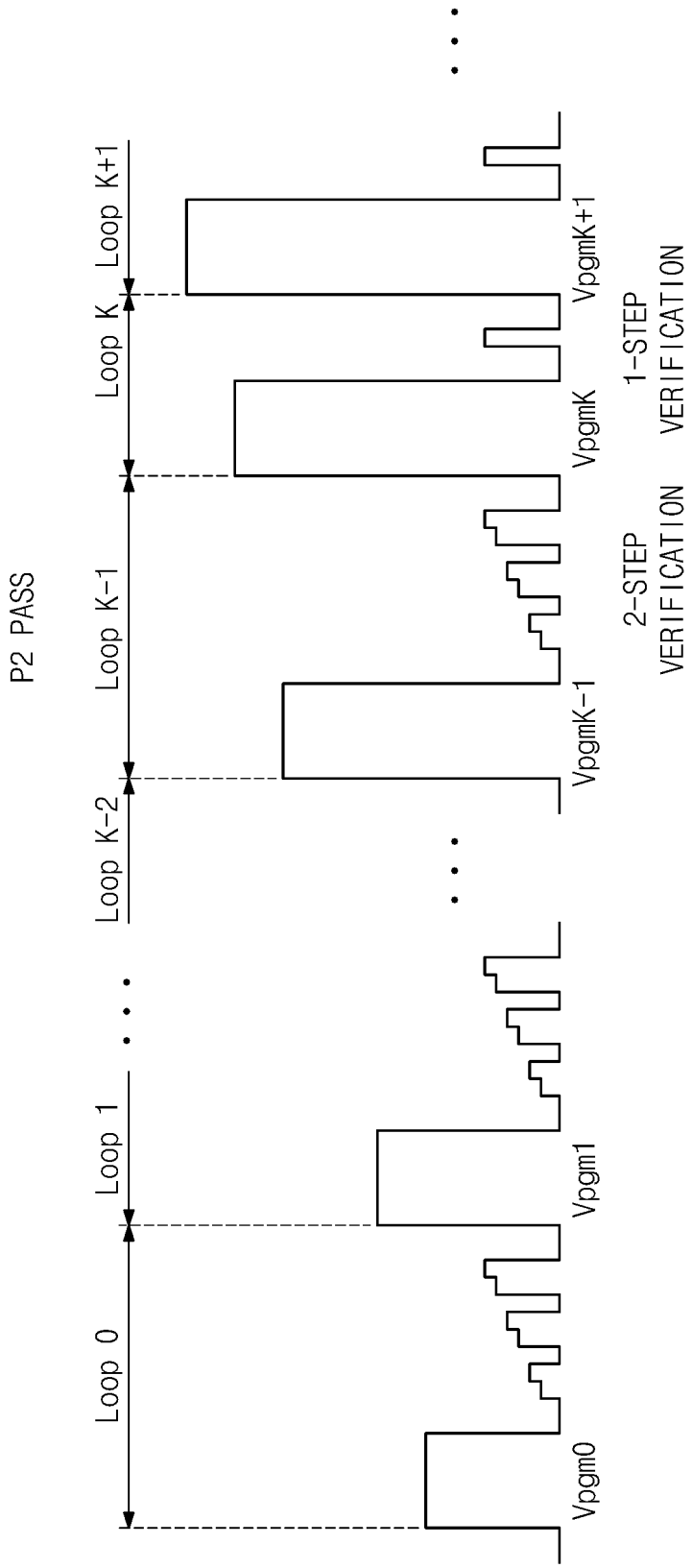
FIG. 16 is a waveform diagram further illustrating a series of programming/verification pulses applied to nonvolatile memory cells according to embodiments of the inventive concept.

FIG. 16 is a diagram illustrating one possible sequence of programming voltages and verification pulses that might be applied during a programming operation over a number of programming intervals within the embodiment described in relation to FIG. 14.

Referring to FIG. 16, a sequence of ISPP defined programming voltages ($V_{pgm0}$-$V_{pgmx+1}$) are applied over programming intervals 0 though K+1. During programming intervals 0 though K−1, verification pulses consistent with the 2-step verification mode are applied to the selected memory cell(s) following each programming voltage. However, during the K−1th programming interval, it is assumed that the threshold voltage of the selected memory cells(s) reaches or exceeds the pass threshold voltage P2. Accordingly, during the Kth and subsequent programming intervals, the 1-step verification mode is selected and verification pulses consistent with the 1-step verification mode are applied to the selected memory cell(s) following each programming voltage.

Figure 17:
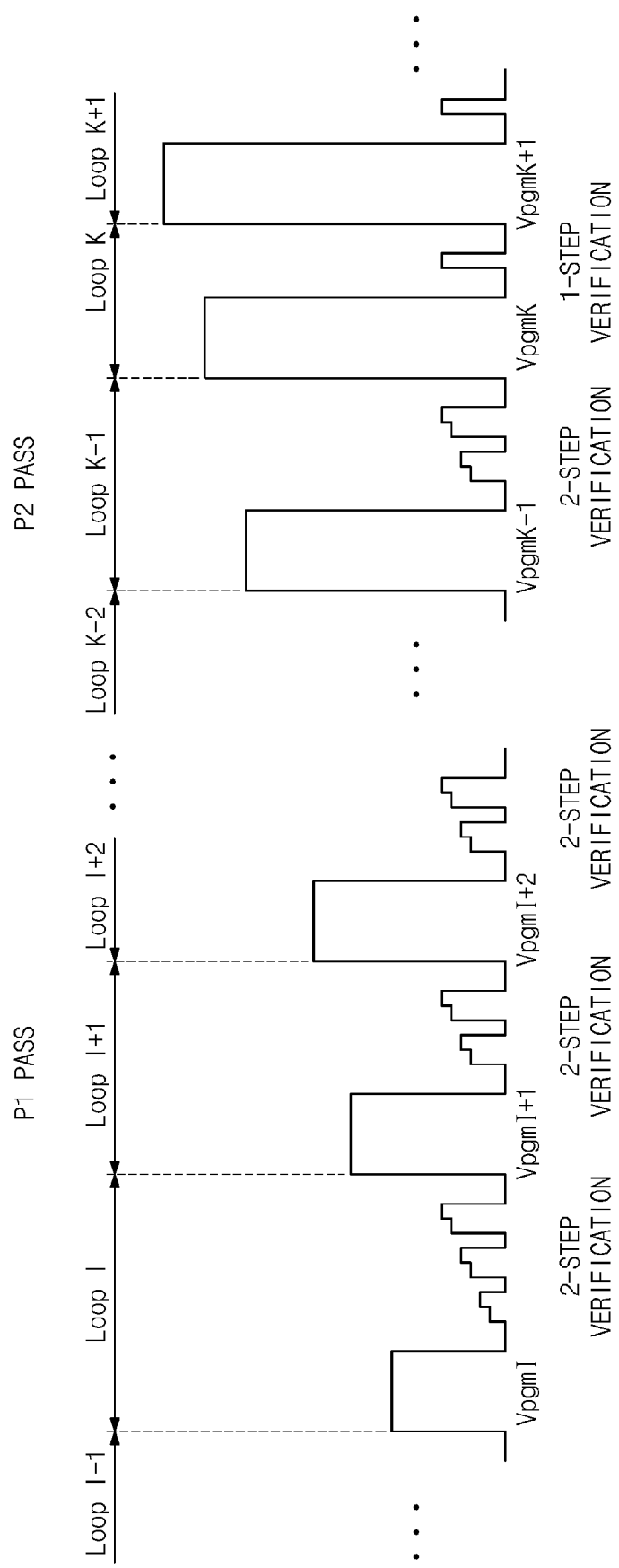
FIG. 17 is a waveform diagram further illustrating a series of programming/verification pulses applied to nonvolatile memory cells according to embodiments of the inventive concept.

FIG. 17 is a diagram illustrating yet another possible sequence of programming voltages and verification pulses that might be applied during a programming operation over a number of programming intervals within the embodiment described in relation to FIG. 14.

Referring to FIG. 17, two different pass threshold voltages are used P1 and P2. A first pass threshold voltage P1 indicates a threshold voltage boundary separating the first programming state P1 from the second programming state P2. A first-type, 2-step verification mode is selected for use when the threshold voltage of the selected memory cell(s) is less than P1 (e.g., during programming intervals I−1 though I). However, a different second-type (e.g., using different verification pulses) 2-step verification mode is selected for use once the threshold voltage of the selected memory cell(s) reaches or exceeds P1 (e.g., during programming intervals I+1 through K−1). Finally, a 1-step verification mode is selected for use when the threshold voltage of the selected memory cell(s) reaches or exceeds P2 (e.g., during programming intervals K and onward).

The embodiment illustrated in FIGS. 16 and 17 further illustrate how the number of programming intervals during a programming operation may be reduced, thereby reducing the time required to program MLCs and generally reduce memory cell wear. Those skilled in the art will recognize from the foregoing description that programming state may be used as a programming condition which may be evaluated and used to select an appropriate verification mode. Of further note, the use of respective and variously defined pass threshold voltages in this regard is only one of many different ways that respective programming state may be evaluated.

Figure 18:
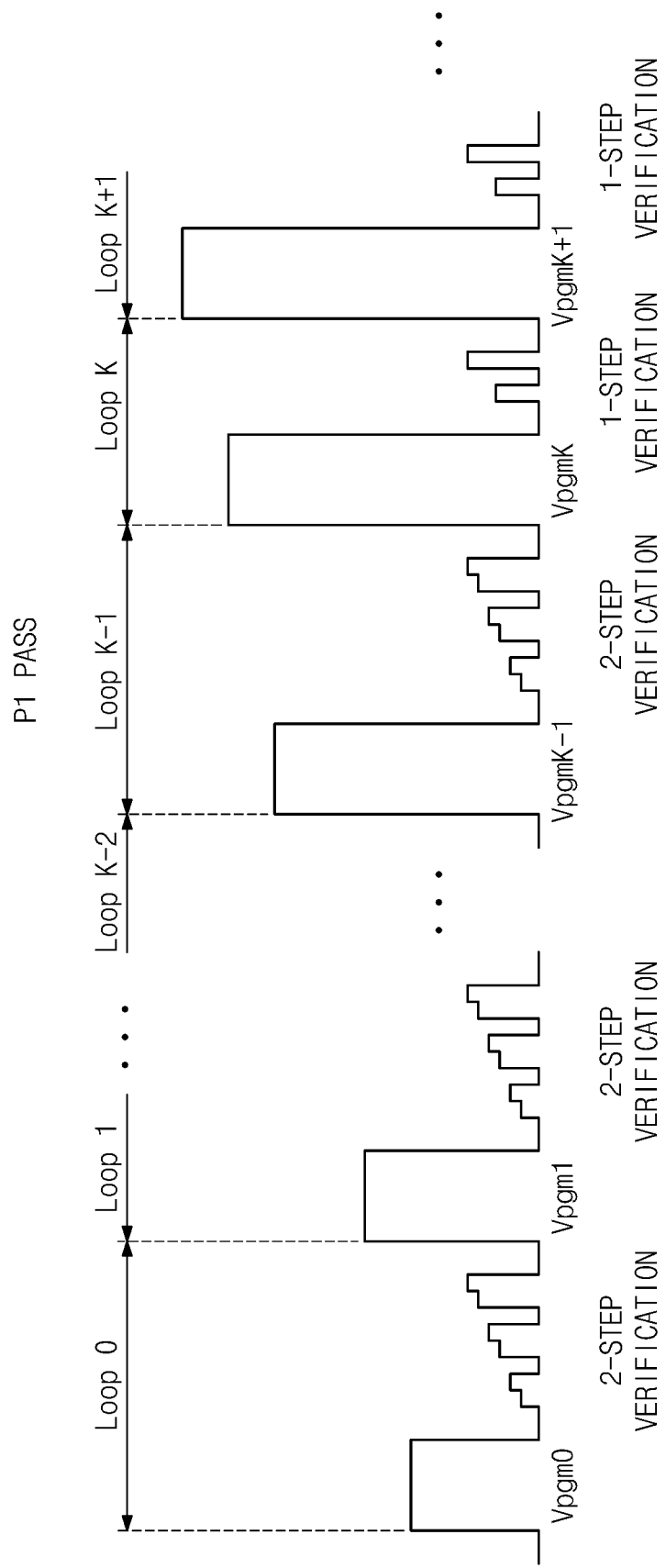
FIG. 18 is a waveform diagram further illustrating a series of programming/verification pulses applied to nonvolatile memory cells according to embodiments of the inventive concept.

As further illustrated by the example of FIG. 18, the nature and composition of the verification voltages applied during a particular verification operation may also be changed in relation to a particular programming state. In FIG. 18, beginning with the programming interval K (following a threshold voltage detection greater than or equal to P1) respective verification pulses are applied to verify only the second and third programming states P2 and P3, since passing P1 indicates conclusion of programming for the first programming state. Here again, the overall reduction of verification pulses within a selected verification mode made in relation to particular programming state(s) reduces overall programming time, memory cell wear, and power consumption.

Figure 19:
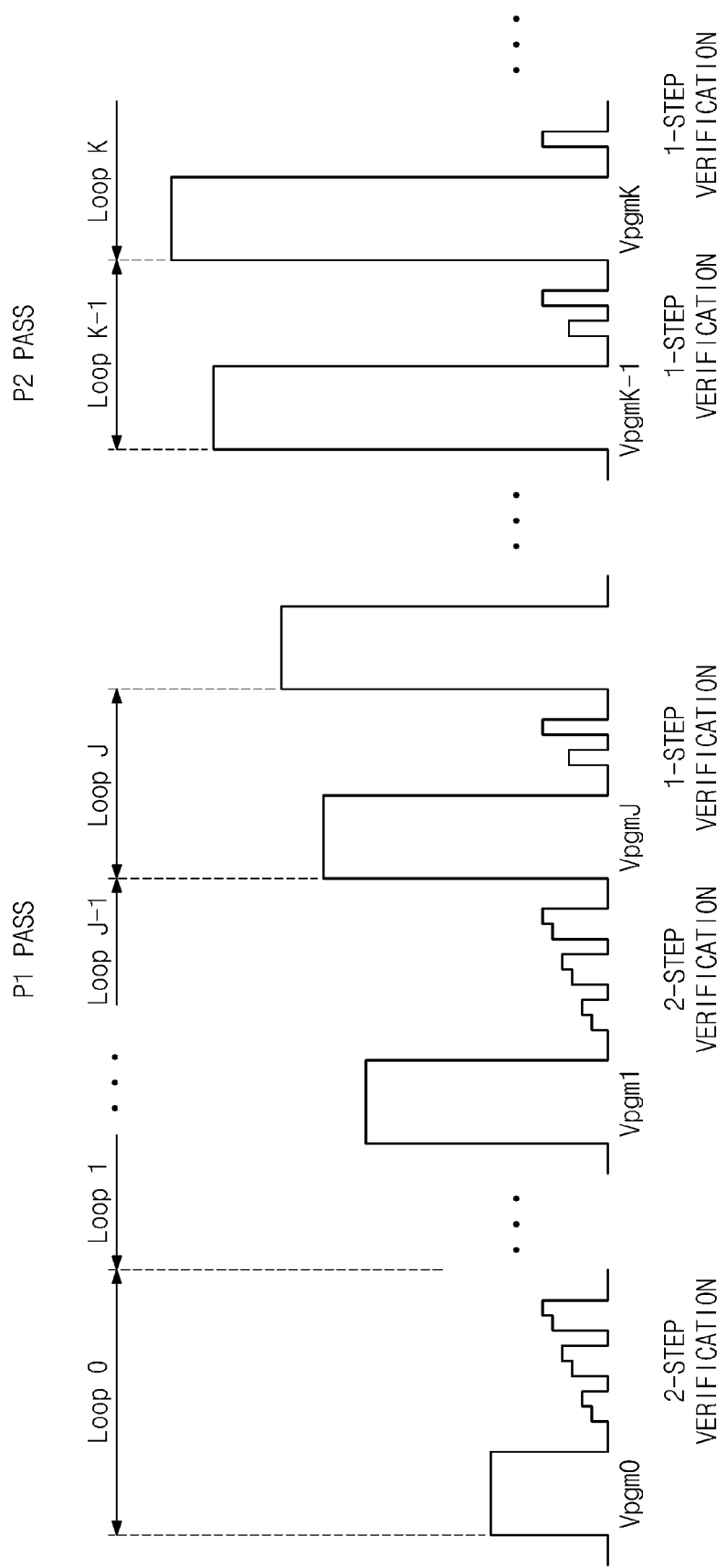
FIG. 19 is a waveform diagram further illustrating a series of programming/verification pulses applied to nonvolatile memory cells according to embodiments of the inventive concept.

The embodiment of the inventive concept illustrated in FIG. 19 combines a number of the teachings previously presented. Again, FIG. 19 is a diagram illustrating yet another possible sequence of programming voltages and verification pulses that might be applied during a programming operation over a number of programming intervals within the embodiment described in relation to FIG. 14. First and second pass threshold voltages P1. P2 are used to indicate programming state and select verification mode (e.g., between 1-step and 2-step verification modes). Further, the selective application of verification pulses as a function of programming state is made. That is, two verification pulses are applied during the second programming state (P1≧$V_{TH}$>P2), and one verification pulse is applied during the third programming state (P2≧$V_{TH}$).

Figure 20:
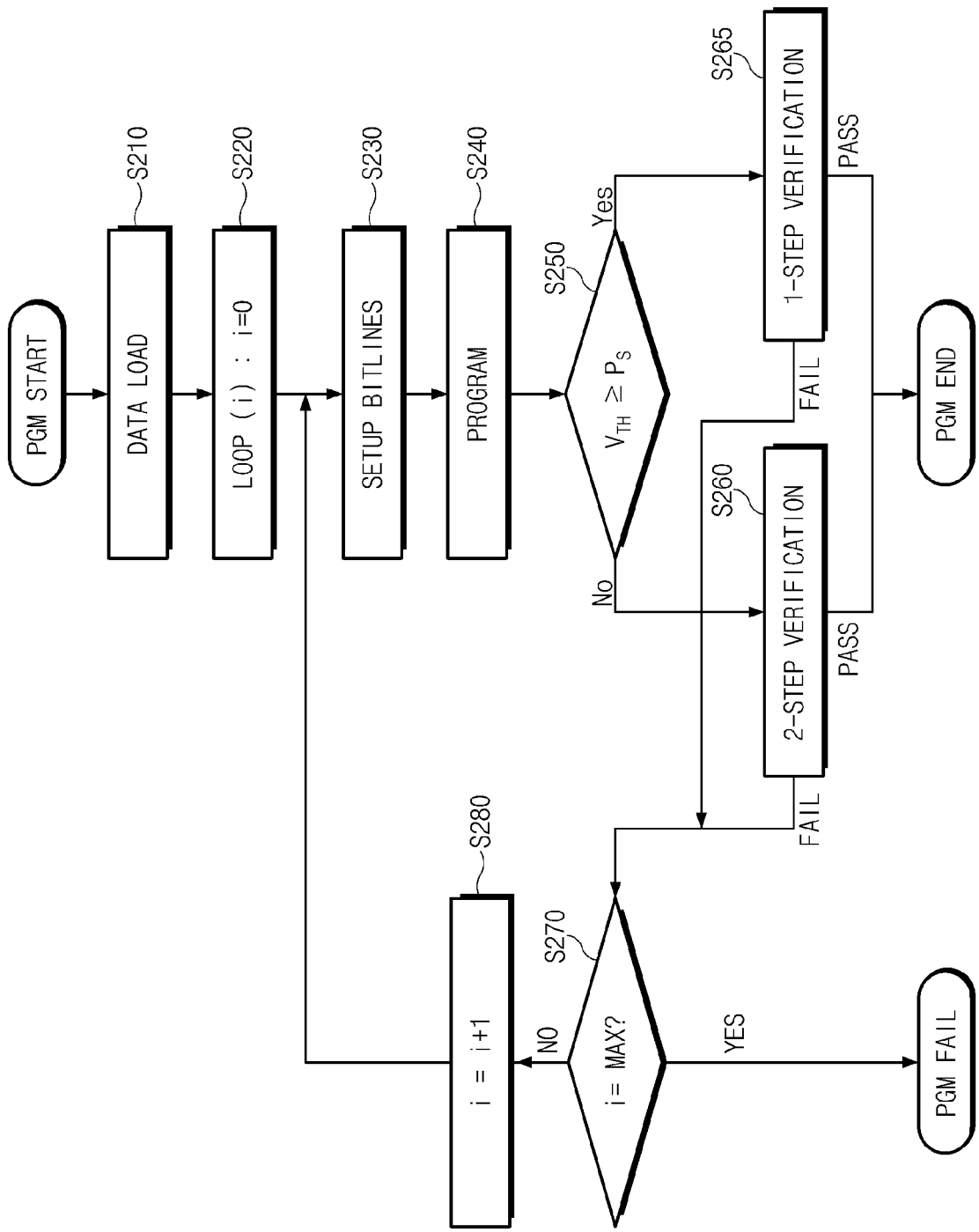
FIG. 20 is a flowchart summarizing in relevant portion a method of operating (including a method of programming) a nonvolatile memory and/or memory system according to embodiments of the inventive concept.

FIG. 20 is a flowchart summarizing a method of operating, including a method of programming, for a nonvolatile memory device, such as nonvolatile memory device 200 of FIG. 14 according to an embodiment of the inventive concept.

Referring collectively to FIGS. 14 through 18, a programming method for the nonvolatile memory device 200 according to an embodiment of the inventive concept is as follows.

Program data is loaded into the page buffer circuit 230 through the data I/O circuit 240 (S210). Then, the control logic 260 controls the execution of a the first program loop (i=0) (S220).

The bit lines $BL_0$ to $BL_{n-1}$ are set up according to program data loaded into the page buffer circuit 230 (S230). Then, a pass voltage is applied to unselected word lines and a program voltage applied to the selected word line to program the selected memory cell(s) (S240). For example, the control logic 260 may control the page buffer circuit 230 and voltage generator 250 to apply a bit line forcing voltage BLFV (e.g., 1.0V) to bit lines that are connected to fast memory cells. On the other hand, the control logic 260 may control the page buffer circuit 230 and voltage generator 250 to apply a bit line program voltage BLPV (e.g., 0.0V) to the bit lines connected to slow memory cells.

Then, the verification mode selector 262 of control logic 260 determines whether a certain programming state has been reached by reference to a corresponding pass threshold voltage (e.g., whether $V_{TH}$≧$P_S$, where $P_S$ is a pass threshold voltage for a particular programming state "S"). This determination by the verification mode selector 262 may be used within the control logic 260 to select a verification mode from a plurality of possible verification modes (S250).

For example, in the illustrated example of FIG. 20, if a certain programming state $P_S$ has not been entered, or a corresponding pass threshold voltage has not been reached or exceeded (S250=NO), a 2-step verification mode is selected and executed (S260). However, if a certain programming state $P_S$ has been entered, or a corresponding pass threshold voltage has been reached or exceeded (S250=YES), a 1-step verification mode is selected and executed (S265). Successful verification by either verification mode (S260 or S265=PASS), results in termination of the programming operation.

Failed verification by either verification mode (S260 or S265=NO) results in a next programming interval i=i+1 (S280), unless a maximum number of programming intervals (MAX) has been reached (S270=YES).

Embodiments of the inventive concept may be variously implemented in many different types of nonvolatile memory devices, memory systems, and host devices incorporating memory devices and memory systems. For example, vertical NAND flash memory devices may be configured and operated in a manner consistent with an embodiment of the inventive concept.

Figure 21:
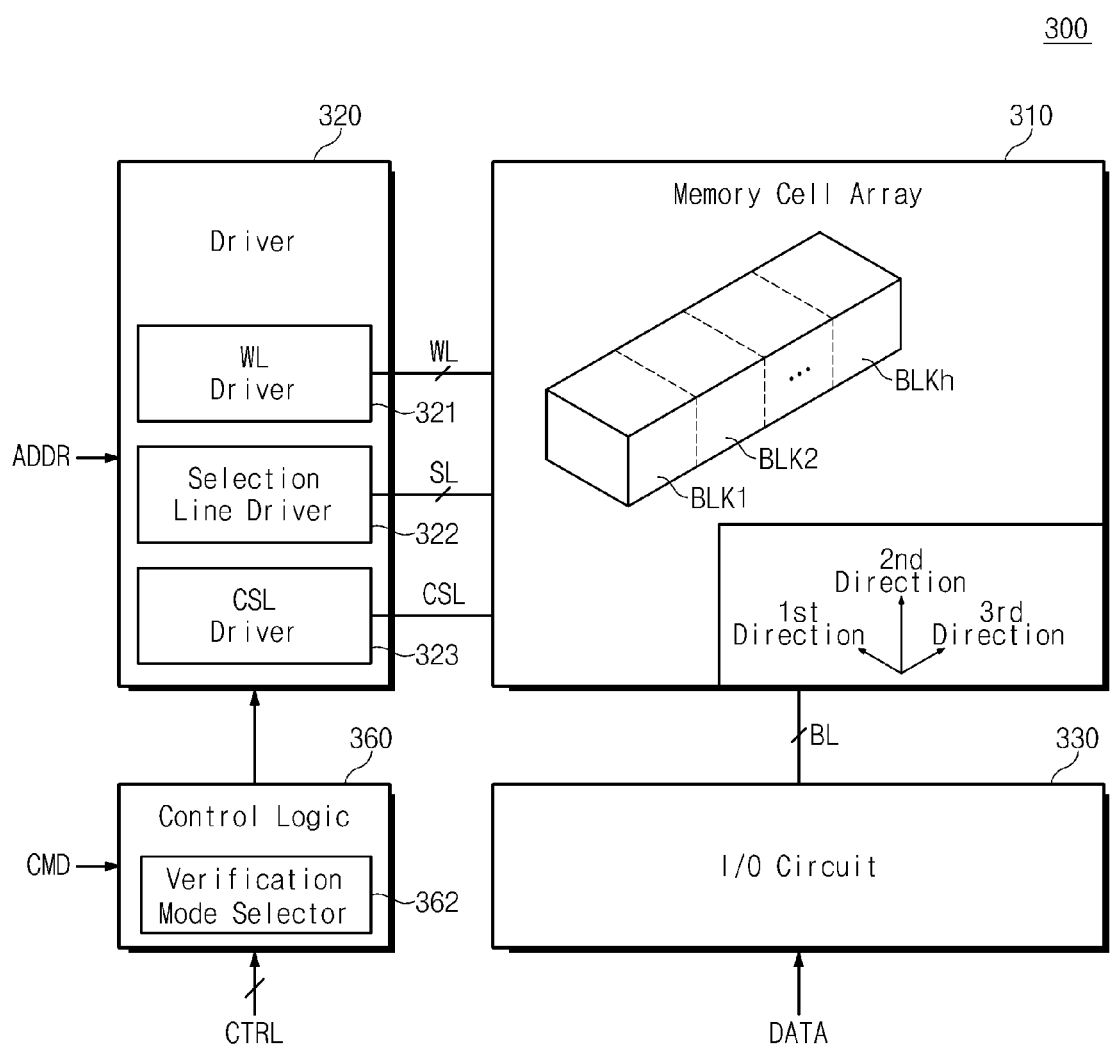
FIG. 21 is a partial block diagram of a nonvolatile memory device that may be operated and programmed according to embodiments of the inventive concept.

FIG. 21 is a diagram illustrating a nonvolatile memory device according to an embodiment of the inventive concept. Referring to FIG. 21, a nonvolatile memory device 300 comprises a memory cell array 310, a driver 320, an input/output (I/O) circuit 330, and a control logic 360.

The memory cell array 310 is configured to include a plurality of memory blocks BLK1 to BLKh. Each of the memory blocks BLK1 to BLKh includes a plurality of memory cells arranged in a vertical (or stacked) structure (i.e., the plurality of memory blocks are arranged in three dimensions). That is, certain embodiments of the inventive concept include memory blocks BLK1 to BLKh having structures that are expanded in first, second and third directions. Other embodiments of the inventive concept include memory blocks BLK1 to BLKh having NAND strings expanded in one of the three possible directions. Still other embodiment of the inventive concept includes memory blocks BLK1 to BLKh having NAND strings extending in multiple directions of the three possible directions.

Each of the NAND strings is connected to one bit line BL, at least one string selection line SSL, at least one ground selection line GSL, one word line WL, and one common source line CSL. That is, each of the memory blocks BLK1 to BLKh is connected to a plurality of bit lines BL, a plurality of string selection lines SSL, a plurality of ground selection lines GSL, a plurality of word lines WL, and a plurality of common source lines CSL.

The driver 320 is connected to the memory cell array 310 through at least a plurality of word lines WL. The driver 320 operates according to the control of the control logic 360. The driver 320 receives an externally provided address ADDR.

The driver 320 decodes the address ADDR and selects one of the word lines WL according to the decoded address. The driver 320 applies a voltage to selected and unselected word lines. The driver 320 also respectively applies a program voltage associated with a programming operation, a read voltage associated with a read operation, or an erase voltage associated with a an erase operation to the word lines WL. The driver 320 may include a word line driver 321 capable of selecting and driving the word lines.

The driver 320 may select and drive a plurality of selection lines SL, a string selection line SSL, and/or a ground selection line GSL. In this regard, the driver 320 may include a selection line driver 322 specifically identified to select and drive the plurality of selection lines SL.

Moreover, the driver 320 may also drive the common source line CSL. In this regard, the driver 320 may include a common source line driver 323 specifically identified to drive the common source line CSL.

The I/O circuit 330 is connected to the memory cell array 310 through a plurality of bit lines BL. The I/O circuit 330 operates under the control of the control logic 360, and is configured to select the bit lines BL.

The I/O circuit 330 may also be configured to receive data (DATA) from an external device and program the received data in the memory cell array 310. Analogously, the I/O circuit 330 may further be configured to read data from the memory cell array 310 and transfer it to an external device.

Depending on the overall capabilities of the nonvolatile memory device 300, the I/O circuit 330 may be further configured to read data from and/or program data to a designated first storage region or a second storage region of the memory cell array 310. Thus, certain embodiments of the I/O circuit 330 contemplate the execution of a conventionally understood copy-back operation.

In certain embodiments of the inventive concept, the I/O circuit 330 may incorporate conventionally understood components, such as page buffer (and/or page registry) circuitry, column selection circuitry, data buffer(s), sense amplifiers, write driver(s), column selection circuitry, etc.

The control logic 360 controls the overall operation of the nonvolatile memory device 300. The control logic 360 operates in response to an externally provided command and/or control signals CTRL. Consistent with the foregoing embodiments, the control logic 360 may perform bit line forcing of fast memory cells or normal programming of slow memory cells during programming operations.

Moreover, the control logic 360 may be configured using hardware, firmware, and/or software to select a verification mode from a plurality of verification modes on the basis of one or more programming condition(s), and to perform a verification operation using the selected verification mode. In this regard, the control logic 360 may include a verification mode selector 362 functioning in a manner similar that previously described.

Figure 22:
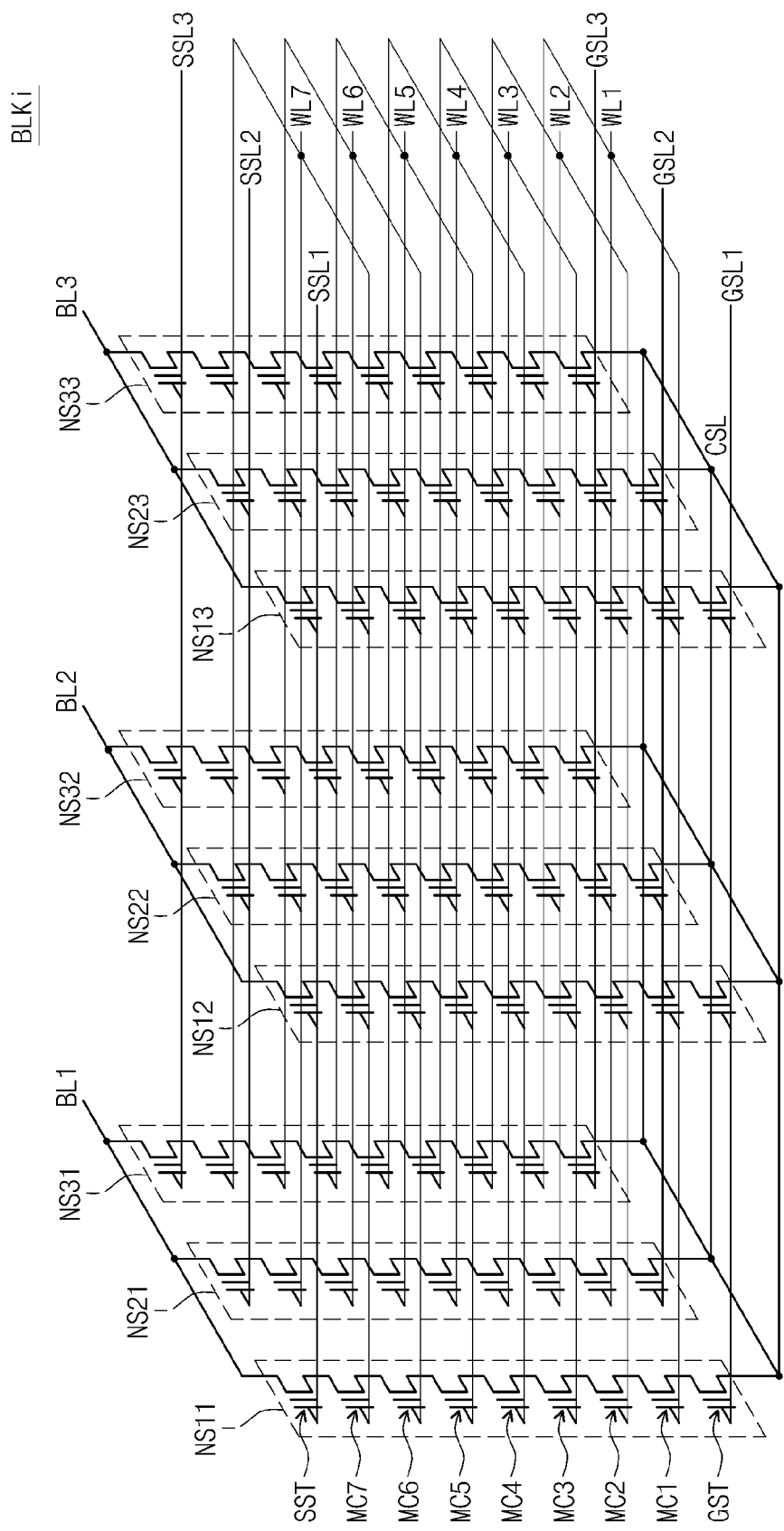
FIG. 22 is a partial circuit diagram further illustrating an equivalent circuit for one memory block of the exemplary memory device of FIG. 21.

FIG. 22 is a circuit diagram shown in relevant portion illustrating an equivalent circuit for a memory block BLKi from the plurality of memory blocks shown in FIG. 21.

Referring to FIGS. 21 and 22, NAND stings NS11 to NS31 are disposed between a first bit line BL1 and a common source line CSL. The first bit line BL1 corresponds to a conductive material extending in the third direction. NAND strings NS12, NS22 and NS32 are disposed between a second bit line BL2 and the common source line CSL. The second bit line BL2 corresponds to a conductive material extending in the third direction. NAND strings NS13, NS23 and NS33 are disposed between a third bit line BL3 and the common source line CSL. The third bit line BL3 corresponds to a conductive material extending in the third direction.

The selection transistor SST for each NAND string NS is connected to a corresponding bit line BL. The ground selection transistor GST for the each NAND string NS is connected to the common source line CSL. Memory cells MC are disposed between the string selection transistor SST and ground selection transistor GST of the each NAND string NS.

Hereinafter, NAND strings NS will be defined in row and column units. NAND strings NS, which are connected to one bit line in common, forms one column. Thus, NAND strings NS11 to NS31 are connected to the first bit line BL1 corresponding to a first column. NAND strings NS12 to NS32 are connected to the second bit line BL2 corresponding to a second column, and NAND strings NS13 to NS33 are connected to the third bit line BL3 corresponding to a third column.

NAND strings NS connected to one string selection line SSL form one row. Thus, NAND strings NS11 to NS13 are connected to a first string selection line SSL1 corresponding to a first row. NAND strings NS21 to NS23 are connected to a second string selection line SSL2 corresponding to a second row, and NAND strings NS31 to NS33 are connected to a third string selection line SSL3 corresponding to a third row.

In the each NAND string NS, a height is defined. In the each NAND string NS, the height of a memory cell MC1 adjacent to the ground selection transistor GST is 1. In the each NAND string NS, the more adjacent to the string selection transistor SST the height of each memory cell increases. In the each NAND string NS, the height of a memory cell MC7 adjacent to the string selection transistor SST is 7.

The NAND strings NS of the same row share a sting selection line SSL. The NAND strings NS of different rows are connected to different sting selection lines SSL, respectively. Memory cells having the same height in NAND strings NS on the same row share a word line. In the same height, the word lines WL of NAND strings NS on different rows are connected in common. Word lines WL may be commonly connected in a layer to which the conductive materials extending in the first direction are provided. The conductive materials extending in the first direction may be connected to an upper layer through a contact. The conductive materials extending in the first direction may be commonly connected at the upper layer.

The NAND strings NS of the same row share a ground selection line GSL. The NAND strings NS of different rows are respectively connected to different ground selection lines GSL. That is, NAND strings NS11 to NS13, NS21 to NS23 and NS31 to NS33 are connected to the ground selection line GSL in common. Further, the common source line CSL may be commonly connected to the NAND strings NS.

As illustrated in FIG. 22, word lines WL having the same height are commonly connected. Accordingly, when a specific word line WL is selected, all NAND strings NS connected to the specific word line WL are selected. The NAND strings NS of different rows are connected to different string selection lines SSL. Therefore, by selecting string selection lines SSL1 to SSL3, the NAND strings NS of an unselected row among NAND strings NS connected to the same word line WL may be separated from the bit lines BL1 to BL3. That is, by selecting the string selection lines SSL1 to SSL3, the row of NAND strings NS may be selected. Furthermore, by selecting the bit lines BL1 to BL3, the NAND strings NS of a selected row may be selected in row units.

Figure 23:
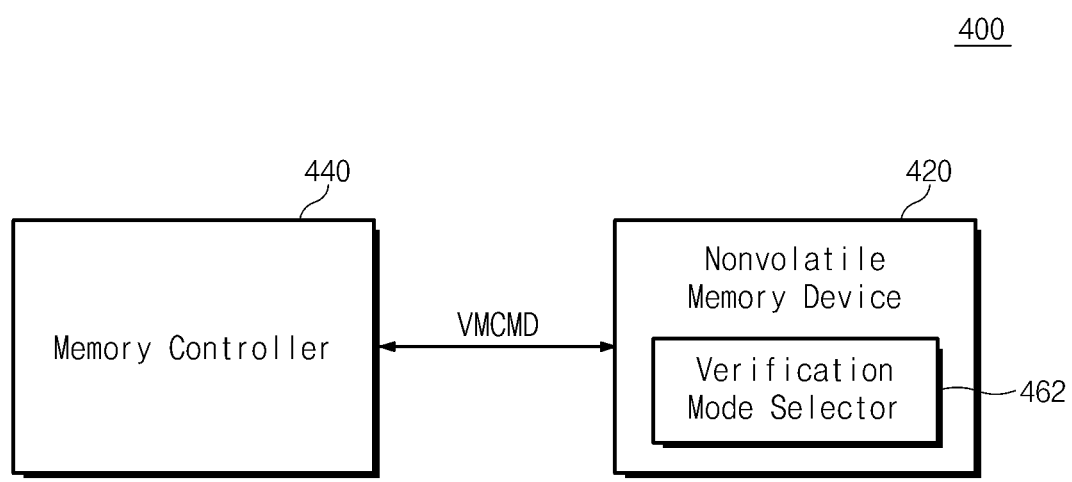
FIG. 23 is a general block diagram of a memory system incorporating a nonvolatile memory device according to embodiments of the inventive concept.

FIG. 23 is a general block diagram illustrating a memory system comprising a nonvolatile memory device according to an embodiment of the inventive concept. Referring to FIG. 23, a memory system 400 comprises a nonvolatile memory device 420 and a memory controller 440.

The nonvolatile memory device 420 includes a verification mode selector 462 configured to select a verification mode from a plurality of verification modes that may be used during a verification operation performed as part of programming the nonvolatile memory device 420. As described in the various embodiments above, the selection of a particular verification mode may be performed on the basis of an evaluation of one or more programming conditions. However, instead of evaluating the programming condition within control logic of the nonvolatile memory device 420, the evaluation may be made by control or computational circuitry disposed in the memory controller 440. Where such is the case, a verification mode selection command VMCMD (along corresponding acknowledgement signals or predicate data upon which such a selection may be made) may be passed between the verification mode selector 422 and the memory controller 440.

Thus, since the control and computational circuitry generally used to control the nonvolatile memory device 420 have been exported to the memory controller 440, the memory controller 440 may be used to evaluate one or more programming conditions, select a verification mode based on the evaluation of the programming condition, generate a corresponding verification mode selection command VMCMD, and communicate the verification mode selection command VMCMD to the nonvolatile memory device 420.

The nonvolatile memory device 420 receives the verification mode selection command VMCMD as any other command from the memory controller 440 and performs a verification operation accordingly. The nonvolatile memory device 420 may perform bit line forcing for fast memory cells and normal programming for slow memory cells in response to corresponding commands from the memory controller 440.

Figure 24:
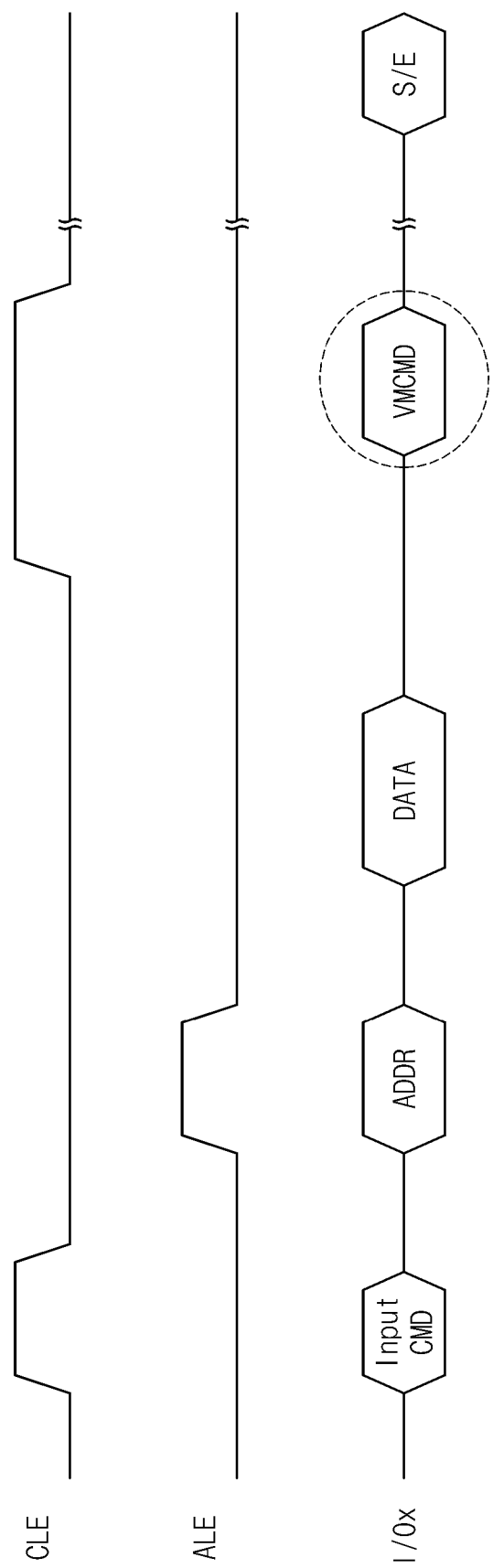
FIG. 24 is a waveform diagram illustrating exemplary control signals communicated by the memory controller of FIG. 23.

FIG. 24 is a signal waveform diagram illustrating one possible arrangement of control signals that may be communicated from the memory controller 440 to the nonvolatile memory device 420 of FIG. 23.

Referring to FIG. 24, the nonvolatile memory device 420 receives a serial data input command in response to a command latch activation signal CLE, and receives an address ADDR for writing data in response to an address latch activation signal ALE. Although not shown, the nonvolatile memory device 420 receives a serial data to be written in response to a writing activation signal, and receives the verification mode selection command VMCMD in response to the command latch activation signal CLE. The nonvolatile memory device 420 performs a verifying operation in a determined verification mode according to the verification mode selection command VMCMD. Subsequently, a result value S/E for the success or error of programming is transmitted to the memory controller 440 through an input/output line IOx.

In FIGS. 23 and 24, the memory controller 440 generates the verification mode selection command VMCMD for selecting a verification mode, and communicates the verification mode selection command VMCMD via an input/output line IOx. However, the scope of the inventive concept is not limited thereto. The memory controller 440 may generate a verification mode selection signal for selecting a verification mode, and transmit it to the nonvolatile memory device 420 through a separate transmission line, instead of using the input/output line IOx.

Figure 25:
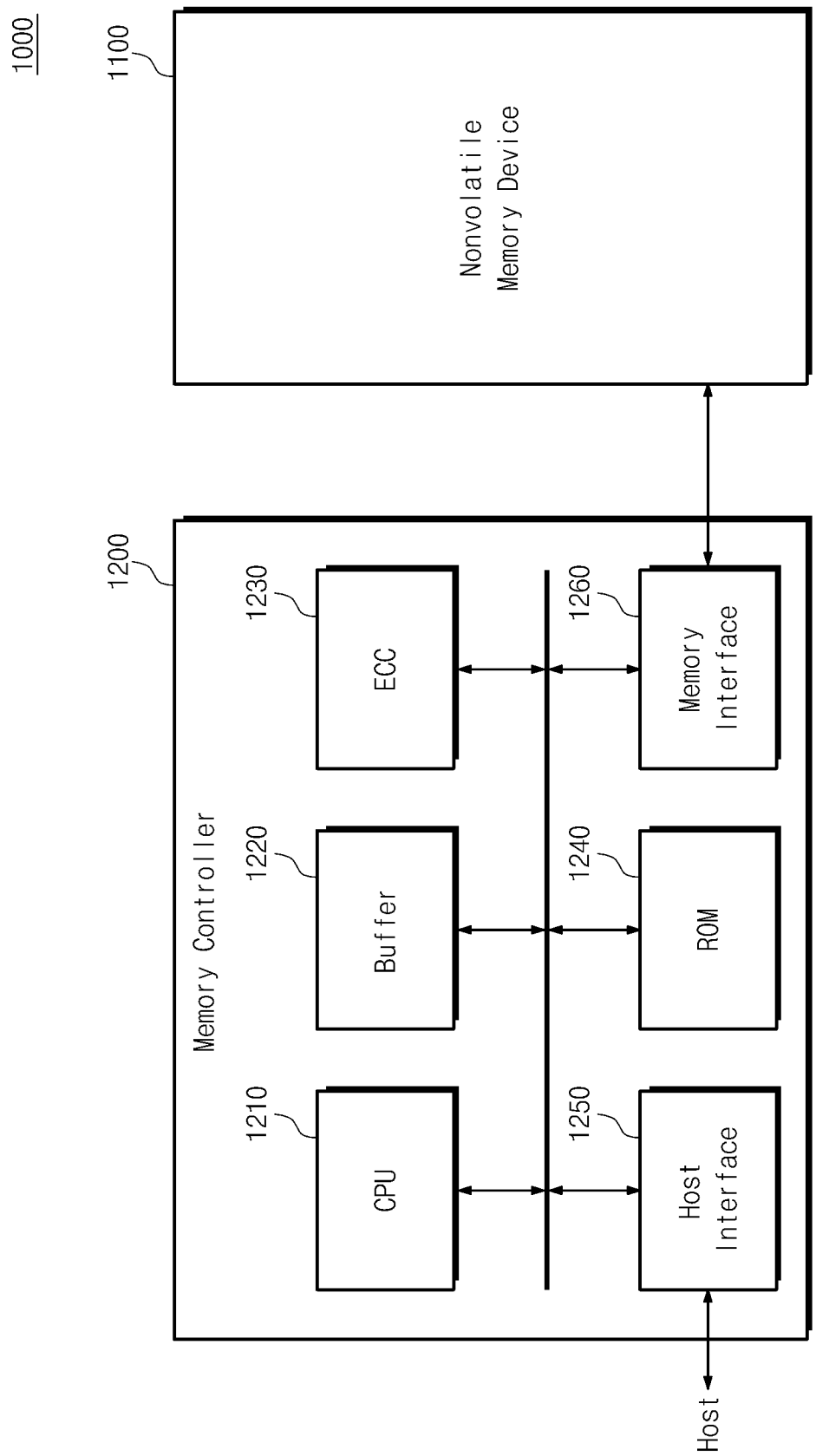
FIG. 25 is a block diagram illustrating a memory system incorporating a nonvolatile memory device according to embodiments of the inventive concept.

FIG. 25 is a block diagram illustrating a memory system according to another embodiment of the inventive concept. Referring to FIG. 23, a memory system 1000 generally comprises a nonvolatile memory device 1100 and a memory controller 1200.

The nonvolatile memory device 1100 is capable of selectively applying bit line forcing control voltages to bit lines connected to fast memory cells, or applying normal control voltages to bit lines connected to slow memory cells. Nonvolatile memory device 1100 is also capable of executing a plurality of verification modes in relation to selected memory cell(s). For example, the nonvolatile memory device 1100 may be configured to implement the method of operating summarized in FIG. 3. In certain embodiments, the nonvolatile memory device 1100 may have a configuration and operation similar to that of nonvolatile memory device 100 of FIG. 9, the nonvolatile memory device 200 of FIG. 14, the nonvolatile memory device 300 of FIG. 21, or the nonvolatile memory device 420 of FIG. 23.

The memory controller 1200 is configured to control the nonvolatile memory device 1100 according to the data requests made by an external device (e.g. a host). That is, the memory controller 1200 generally controls the programming, read, and erase operations performed within the nonvolatile memory device 1100. If the nonvolatile memory device 1100 is implemented like the nonvolatile memory device 420 of FIG. 23, then the memory controller 1200 may be implemented like the memory controller 440.

The memory controller 1200 essentially provides an interface between the nonvolatile memory device 1100 and the host. That is, the memory controller 1200 drives hardware/firmware and/or executes software to control the functionality of the nonvolatile memory device 1100.

In the illustrated example of FIG. 25, the memory controller 1200 comprises a central processing unit (CPU) 1210, a buffer 1220, an error correction circuit (ECC) 1230, a ROM 1240, a host interface 1250, and a memory interface 1260.

The CPU 1210 controls the overall operation of the memory controller 1200.

The buffer 1220 is used as the working memory for the CPU 1210. In response to a program request from the host, program data received from the host is temporarily stored in the buffer 1220. In response to a read request received from the host, data retrieved from the nonvolatile memory device 1100 is temporarily stored in the buffer 1220.

The error correction circuit 1230 decodes data stored in the buffer 1220 using one of many conventional error correction coding schemes during a program request. At this point, the decoded data and an error correction code value used are stored in the nonvolatile memory device 1100. The error correction circuit 1230 restores data read from the nonvolatile memory device 1100 using the error correction code value accompanying read data during a read request.

The ROM 1240 stores software and corresponding data necessary to drive the memory controller 1200.

The host interface 1250 operate according to a defined protocol that is used to exchange data between the host and memory controller 1200. In certain embodiments of the inventive concept, the memory controller 1200 communicates with the host (or other external device) using one of various interface protocols such as a Universal Serial Bus (USB) protocol, a Multimedia Card (MMC) protocol, a Peripheral Component Interconnection (PCI) protocol, a PIC-Express (PCI-E) protocol, an Advanced Technology Attachment (ATA) protocol, a Serial-ATA protocol, a Parallel-ATA protocol, a Small Component Small Interface (SCSI) protocol, an Enhanced Small Disk Interface (ESDI) protocol and a Integrated Drive Electronics (IDE) protocol.

The memory interface 1260 interfaces the nonvolatile memory device 1100 and the memory controller 1200.

The memory system 1000 is capable of executing dynamically selected verification operation(s), as described above, in relation to programming operations that are capable of selectively performing bit line forcing or normal programming, depending on the relative speed of the selected memory cells. This capability allows the memory system 1000 to generally increase reliability, reduce the average number of required programming intervals for each programming operation, and yet not sacrifice programming accuracy. As described above, this selection of verification mode may be made in relation to programming conditions including temperature and/or noise.

Figure 26:
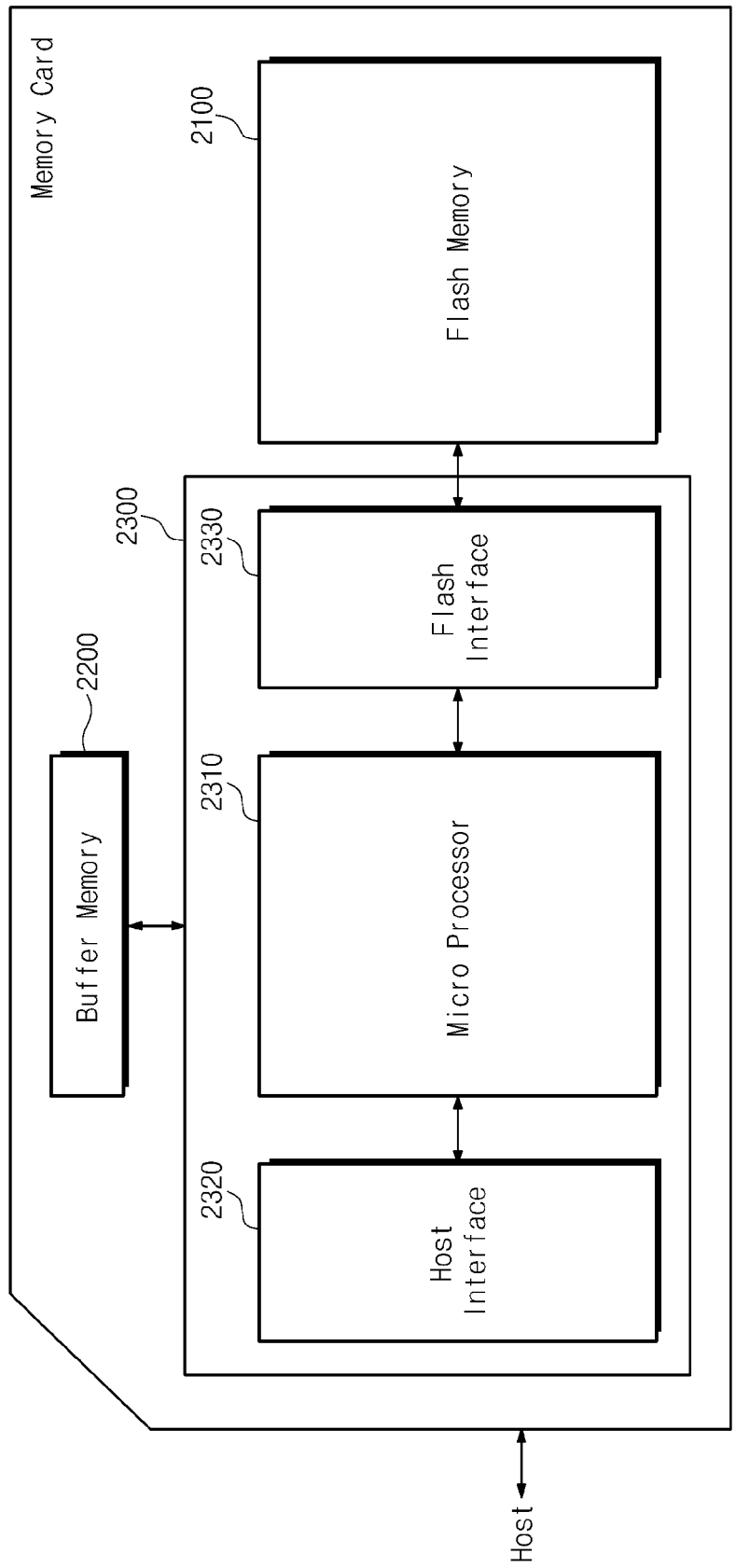
FIG. 26 is a block diagram illustrating one more particular form of memory system (i.e., a memory card) incorporating a nonvolatile memory device according to embodiments of the inventive concept.

FIG. 26 is a block diagram illustrating a memory card according to an embodiment of the inventive concept. Referring to FIG. 26, a memory card 2000 generally comprises a flash memory device 2100, a buffer memory 2200, and a memory controller 2300.

As before, the flash memory device 2100 is configured to apply a bit line forcing control voltages to bit lines connected to fast memory cells and normal programming control voltages to bit lines connected to slow memory cells. The flash memory device 2100 is also configured to dynamically select a verification mode from a plurality of verification modes. For example, the flash memory device 2100 may be a storage device capable of implementing the programming method of FIG. 3. Alternately, the flash memory device 2100 may be configured and operated like the nonvolatile memory device 100 of FIG. 9, the nonvolatile memory device 200 of FIG. 14, the nonvolatile memory device 300 of FIG. 21, or the nonvolatile memory device 420 of FIG. 23.

The buffer memory 2200 may be configured to temporarily store program data and read data associated with programming and read operations performed by the memory card 2000. The buffer memory 2200 may be implemented using volatile memory devices, such as conventionally available DRAM and/or SRAM.

In the illustrated example of FIG. 26, the memory controller 2300 is connected between a host and the flash memory device 2100. In response to a request from the host, the memory controller 2300 accesses the flash memory device 2100. If the flash memory device 2100 is implemented like the nonvolatile memory device 420 of FIG. 23, the memory controller 2300 may be implemented like the memory controller 440.

The memory controller 2300 comprises a microprocessor 2310, a host interface 2320, and a flash interface 2330. The microprocessor 2310 may be implemented to drive hardware, firmware, and or software to control the operation of the memory card 2000. The host interface 2320 interfaces with the host through a defined memory card protocol, such as for example, the Multimedia Card (MMC) protocol in order to facilitate the exchange of data between the host and the flash memory 2100. Thus, in various embodiments, a memory card 2000 consistent with the inventive concept may take the form of a MMC, Security Digital (SD) card, mini-SD card, memory stick, smart-media card, trans-flash card, etc.

The flash interface 2330 forms a conventionally understood interface between the flash memory and the memory controller 2300.

Figure 27:
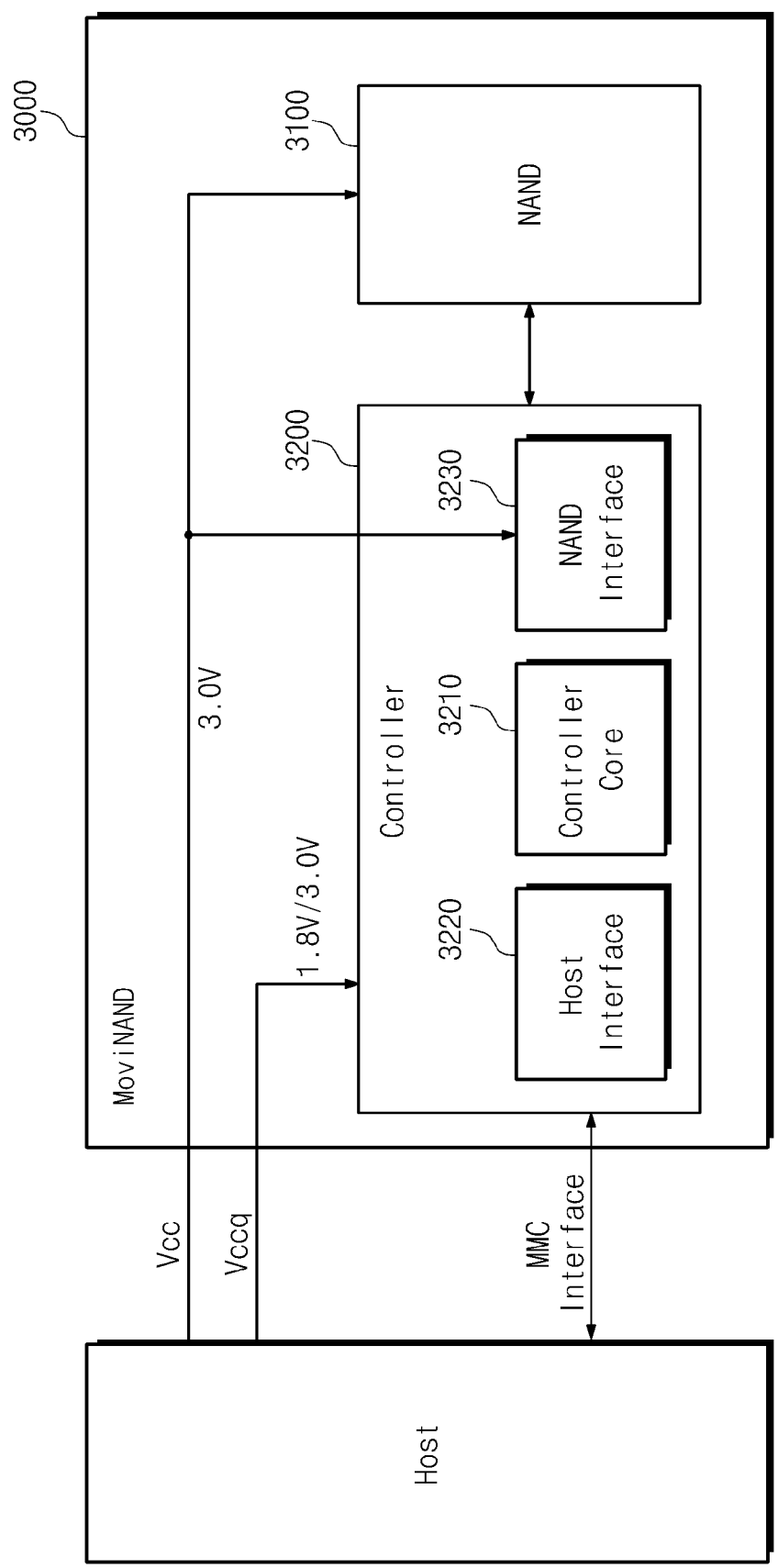
FIG. 27 is a block diagram illustrating another memory system incorporating a more particular form of nonvolatile memory device (i.e., a moviNAND) according to certain embodiments of the inventive concept.

FIG. 27 is a block diagram illustrating a moviNAND according to an embodiment of the inventive concept. Referring to FIG. 27, a moviNAND 3000 generally comprises a NAND flash memory device 3100 and a controller 3200.

The NAND flash memory device 3100 may be implemented by stacking single-product NAND flash memory devices in one package using, for example, a Fine-pitch Ball Grid Array (FBGA) fabrication technique. Each single-product NAND flash memory device may be configured to selectively apply bit line forcing control voltages to bit lines connected to fast memory cells or normal programming control voltages to bit lines connected slow memory cells. Each single-product NAND flash memory device may be further configured to select one verification mode from a plurality of verification modes based on one or more programming conditions. For example, each single-product NAND flash memory devices may be configured and operated like the nonvolatile memory device 100 of FIG. 9, the nonvolatile memory device 200 of FIG. 14, the nonvolatile memory device 300 of FIG. 21, or the nonvolatile memory device 420 of FIG. 23.

In the illustrated example of FIG. 27, the controller 3200 comprises a controller core 3210, a host interface 3220, and a NAND interface 3230. The controller core 3210 controls the overall operation of the moviNAND 3000. The host interface 3220 interfaces the controller 3210 and the MMC of the host. The NAND interface 3230 interfaces the NAND flash memory device 3100 and the controller 3200. If the single-product NAND flash memory device of the NAND flash memory device 3100 is implemented like the nonvolatile memory device 420 of FIG. 23, the controller 3200 may be implemented like the memory controller 440.

The moviNAND 3000 receives power source voltages Vcc and Vccq from the host. In certain embodiments, a power source voltage Vcc of 3.0V is provided to the NAND flash memory device 3100 and the NAND interface 3230, and a power source voltage of 1.8V/3.0V is provided to the controller 3200.

The moviNAND 3000 may be applied to Solid State Drives (SSDs).

Figure 28:
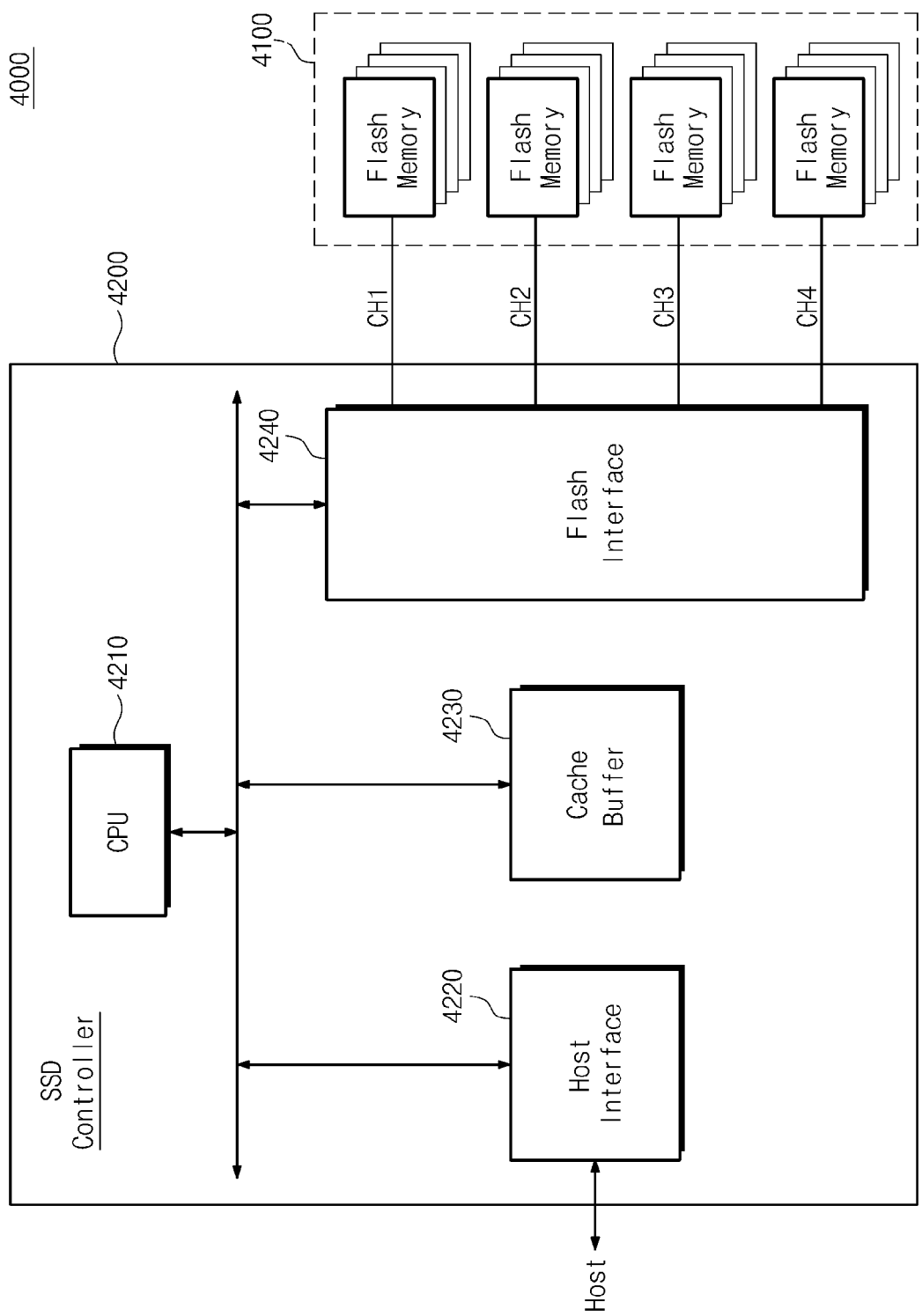
FIG. 28 is a block diagram illustrating an exemplary solid-state drive (SSD) incorporating a nonvolatile memory device according to embodiments of the inventive concept.

FIG. 28 is a block diagram illustrating an SSD according to an embodiment of the inventive concept. Referring to FIG. 28, an SSD 4000 comprises a plurality of flash memory devices 4100 and an SSD controller 4200.

Each flash memory device 4100 may be configured to apply bit line forcing control voltages to bit lines connected to fast memory cells, or normal programming voltages to the bit lines connected to slow memory cells. Each flash memory device 4100 may be further configured to select a verification mode from a plurality of verification modes. For example, each flash memory device 4100 may be configured and operated like the nonvolatile memory device 100 of FIG. 9, the nonvolatile memory device 200 of FIG. 14, the nonvolatile memory device 300 of FIG. 21, or the nonvolatile memory device 420 of FIG. 23.

The SSD controller 4200 controls the flash memory devices 4100, and comprises a CPU 4210, a host interface 4220, a cache buffer 4230, and a flash interface 4240.

The host interface 4220 exchanges data with a host using a protocol under the control of the CPU 4210. The host interface 4220 may use, for example, the Serial Advanced Technology Attachment (SATA) interface, Parallel Advanced Technology Attachment (PATA) interface, and/or External SATA (ESATA) interface.

Data provided to the host interface 4220 from the host or data communicated to the host may be transferred via the cache buffer 4230 without passing through a CPU bus, albeit under the control of the CPU 4210.

The cache buffer 4230 temporarily stores a mobile data between an external device and the flash memory devices 4100. Moreover, the cache buffer 4230 is even used to store programs to be operated by the CPU 4210. The cache buffer 4230 may be treated as a kind of buffer memory, and may be implemented with an SRAM.

The flash interface 4240 interfaces the SSD controller 4200 and the flash memory devices 4100 that are used as a storage device. The flash interface 4240 may support a NAND flash memory, a One-NAND flash memory, a multi level flash memory and a single level flash memory.

Figure 29:
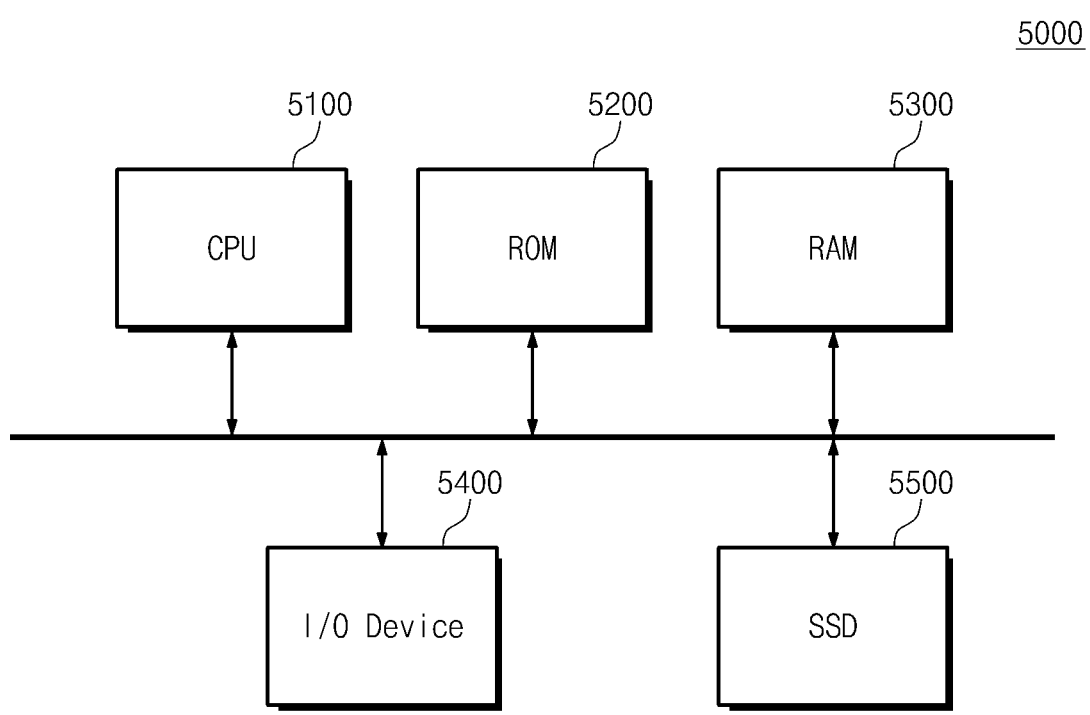
FIG. 29 is a general block diagram illustrating a computational system incorporating a SSD like the one illustrated in FIG. 28 according to embodiments of the inventive concept.

FIG. 29 is a block diagram illustrating a computational system comprising the SSD 4000 of FIG. 28 according to an embodiment of the inventive concept. Referring to FIG. 29, a computational system 5000 comprises a CPU 5100, a ROM 5200, a RAM 5300, an input/output (I/O) device 5400, and an SSD 5500.

The CPU 5100 is connected via a system bus to the other components. The ROM 5200 stores data necessary for the driving of the computational system 5000. Such data may include an initial command sequence or a basic input/output operation system (BIOS) sequence. The RAM 5300 temporarily stores the data provided by the CPU 5100.

The I/O device 5400 may be at least one of a keyboard, a pointing device (mouse), a monitor and a modem, and may be connected to a system bus through via an I/O device interface.

The SSD 5500 is a readable storage device, and may be implemented like the SSD 4000 of FIG. 28.

Figure 30:
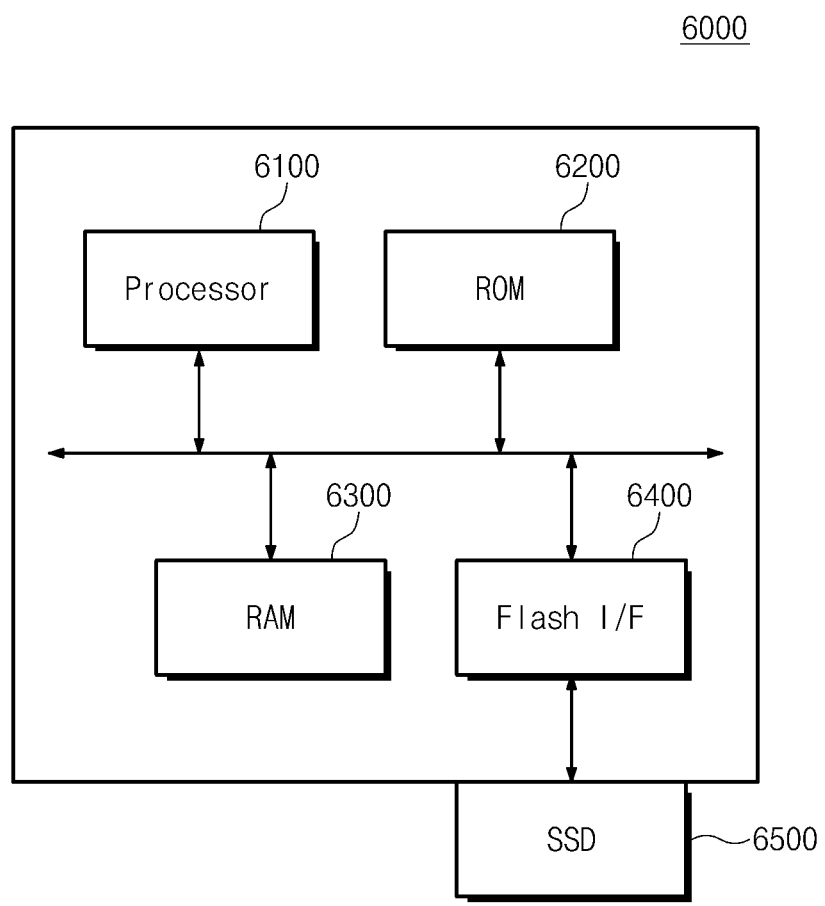
FIG. 30 is a general block diagram illustrating an electronic device capable of incorporating a SSD like the one illustrated in FIG. 28 according to embodiments of the inventive concept.

FIG. 30 is a block diagram illustrating a host device incorporating an SSD like the SSD 4000 of FIG. 28 according to an embodiment of the inventive concept. Referring to FIG. 30, a host device 6000 comprises a processor 6100, a ROM 6200, a RAM 6300, a flash interface 6400, and an SSD 6500.

The processor 6100 accesses the RAM 6300 and ROM 6200 to execute firmware and/or software and drive hardware controlling the functionality of the host device 6000. The ROM 6200 may provide the processor 6100 with a command sequence including an initial command sequence or a basic input/output operation system (BIOS). The flash interface 6400 interfaces the electronic 6000 and the SSD 6500.

The SSD 6500, which may be mechanically attachable/detachable to/from the host device 6000 may be implemented like the SSD 4000 of FIG. 28.

The host device 6000 may take many different forms including (e.g.,) a cellular phone, a Personal Digital Assistant (PDA), a digital camera, a camcorder, a portable audio play device (for example, MP3), and a PMP.

Figure 31:
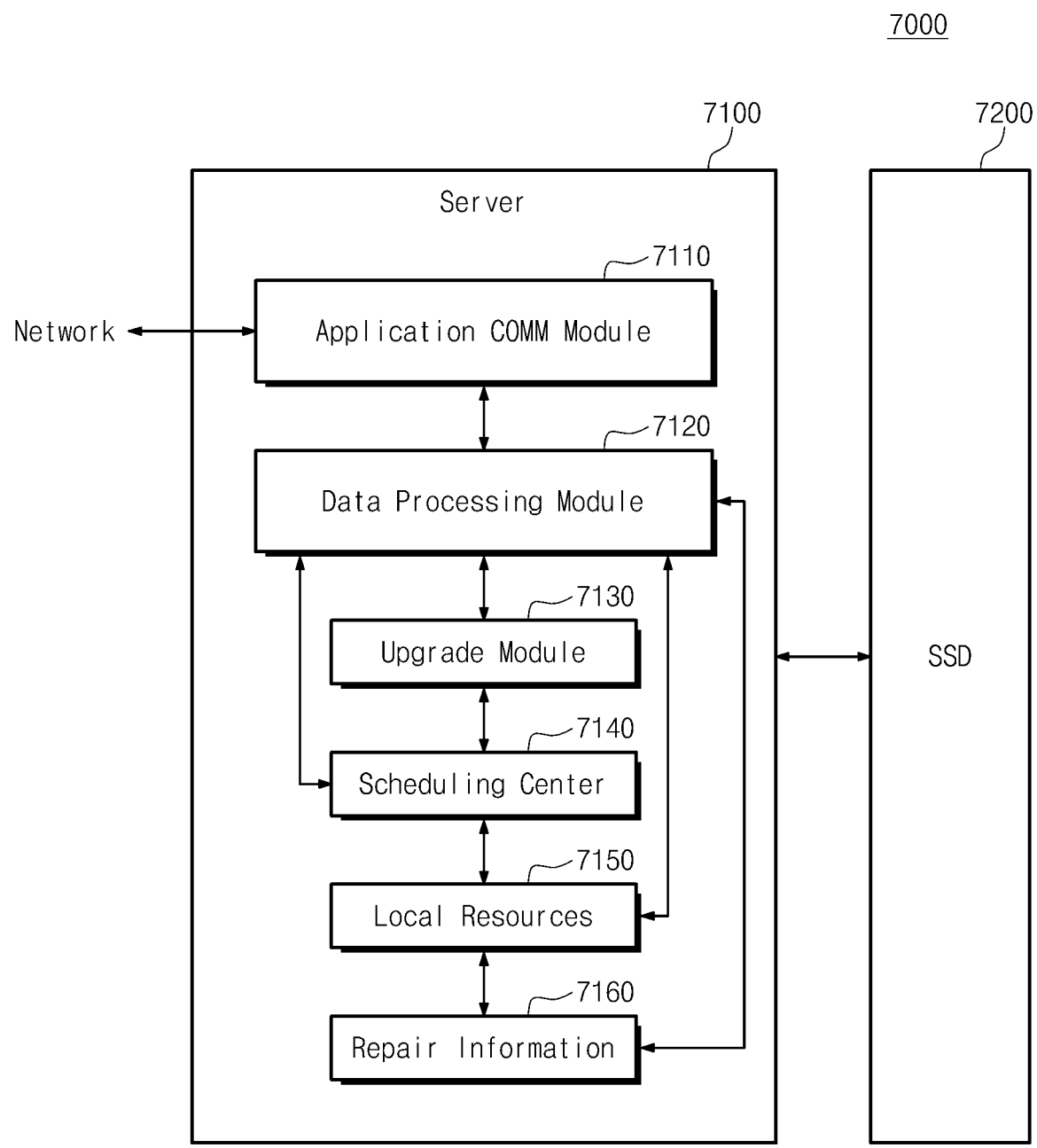
FIG. 31 is a general block diagram illustrating a server system capable of incorporating a SSD like the one illustrated in FIG. 28 according to embodiments of the inventive concept.

FIG. 31 is a block diagram illustrating a server system using a SSD like the SSD 4000 of FIG. 28 according to an embodiment of the inventive concept. Referring to FIG. 31, a server system 7000 comprises a server 7100, and an SSD 7200 necessary for the driving of the server 7100. The SSD 7200 may be configured and operated like the SSD 4000 of FIG. 28.

The server 7100 comprises an application communication module 7110, a data processing module 7120, an upgrade module 7130, a scheduling center 7140, a local resource module 7150, and a repair information module 7160.

The application communication module 7110 communicates with a computing system that is connected to the server 7100 and a network, or allows the server 7100 to communicate with the SSD 7200. The application communication module 7110 transmits data or information, which is applied to a user interface, to the data processing module 7120.

The data processing module 7120 is linked to the local resource module 7150. Herein, the local resource module 7150 applies a list of repair shops/dealers/technical information to a user on the basis of data or information that is inputted to the server 7100.

The upgrade module 7130 interfaces with the data processing module 7120. The upgrade module 7130 upgrades a firmware, a reset code, diagnosis system or other information to an appliance, on the basis of data or information that is inputted to the server 7100.

The scheduling center 7140 allows a real-time option to the user on the basis of data or information that is inputted to the server 7100.

The repair information module 7160 interfaces with the data processing module 7120. The repair information module 7160 is used to apply repair-related information (for example, audio, video, or document file) to the user. The data processing module 7120 packages relevant information on the basis of information that is transferred from the SSD 7100. Subsequently, such information is transmitted to the SSD 7200 or is displayed to the user.

The server 7100 may generate a great deal of heat during its operation. Due to this heat, the reliability of memory cells may decrease during programming operations. However, the server system 7000 comprising the SSD 7200 according to an embodiment of the inventive concept may select an optimal verification mode in response to detected temperature to thereby maintain reliability of the programming operations.

A memory system and/or nonvolatile memory device according to various embodiments of the inventive concept may be mounted within many different types of packaging. For example, memory systems and/or nonvolatile memory devices according to embodiments of the inventive concept may be mounted in packaging using Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP).

As described above, nonvolatile memory devices, memory systems (including memory cards) incorporating nonvolatile memory devices, and related methods of operating same according to embodiments of the inventive concept allow programming operations to selectively use bit line forcing, in conjunction with the selection and use of a verification mode from among a plurality of verification modes to optimize the programming operation.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of operating a nonvolatile memory device, comprising:

executing an i-th programming interval of a programming operation directed to a memory cell by applying an i-th programming voltage to a word line connected to the memory cell and applying either (1) a bit line forcing voltage to a bit line connected to the memory cell if the memory cell is a fast memory cell having a threshold voltage that resides in a proximate threshold voltage range less than a target threshold voltage distribution, or (2) a bit line program voltage less than the bit line forcing voltage to the bit line if the memory cell is a slow memory cell having a threshold voltage that resides in a distant threshold voltage range less than the proximate threshold voltage range;

evaluating a programming condition;

selecting a verification mode from a group of verification modes on the basis of the evaluated programming condition; and executing a verification operation using the selected verification mode in relation to the memory cell.

2. The method of claim 1, wherein the verification operation comprises:

determining that the memory cell is a pass memory cell when a threshold voltage of the memory cell resides in the target threshold voltage distribution;

determining that the memory cell is a fast memory cell when the threshold voltage resides in the proximate threshold voltage range; and determining that the memory cell is a slow memory cell when the threshold voltage resides in the distant threshold voltage range.

3. The method of claim 2, further comprising:

upon determining that the memory cell is a pass memory cell, terminating the programming operation; and upon determining that the memory cell is a fast memory cell or a slow memory cell, executing an i+1th programming interval of the programming operation by applying an i+1th programming voltage to the word line and either (1) applying the bit line forcing voltage to the bit line if the memory cell is a fast memory cell, or (2) applying the bit line program voltage to the bit line if the memory cell is a slow memory cell.

4. The method of claim 3, wherein the i-th and i+1th programming voltages are defined by an incremental step programming pulse (ISPP) scheme, wherein the i+1th programming voltage is greater than the i-th programming voltage by a defined ISPP step voltage.

5. The method of claim 1, wherein the selecting of the verification mode comprises selecting between a single-step verification mode and a multiple-step verification mode.

6. The method of claim 5, further comprising:

defining a programming interval threshold associated with a number of executed programming intervals; and wherein the selecting between the single-step verification mode and the multiple-step verification mode comprises:

comparing a current programming interval with the programming interval threshold, and if the current programming interval is less than the programming interval threshold selecting the multiple-step verification mode, else selecting the single-step verification mode.

7. The method of claim 5, wherein the multiple-step verification mode comprises:

during a first verifying step, comparing a current threshold voltage for the memory cell to a pre-verification voltage; and during a second verifying step, comparing the current threshold voltage to a verification voltage.

8. The method of claim 7, further comprising:

designating the memory cell as a slow memory cell if the current threshold voltage is less than the pre-verification voltage; and designating the memory cell as a fast memory cell if the current threshold voltage is greater than or equal to the pre-verification voltage and less than the verification voltage.

9. The method of claim 7, further comprising:

if the current threshold voltage is determined to be less than the pre-verification voltage during the first verifying step, no precharge voltage is applied to the memory cell during the second verifying step.

10. The method of claim 1, wherein the program condition comprises at least one programming condition selected from a group of programming conditions including; a number of programming intervals executed during the programming operation, a particular programming state for the memory cell, a detected noise, a calculated noise, a detected temperature, a calculated temperature, a change in temperature, a change in threshold voltage distribution for the memory cell, a bias condition, a sensing period for a bit line connected to the memory cell, information indicating wear for the memory cell.

11. The method of claim 1, wherein the memory cell is a multi-level memory cell (MLC) configured to store data in relation to a plurality of states including at least an erase state, a first program state having a threshold voltage greater than the erase state, a second program state having a threshold voltage greater than the first program state, and a third program state having a threshold voltage greater than the second program state, and evaluating the program condition comprises determining that a current programming interval is programming the MLC to one of the plurality of states.

12. The method of claim 11, wherein the selecting of the verification mode comprises:

selecting a first verification mode upon determining that the current programming interval is programming the MLC to the erase state, the first program state, and the second program state; and selecting a second verification mode upon determining that the current programming interval is programming the MLC to the third program state.

13. The method of claim 12, wherein the first verification mode is a multiple-step verification mode and the second verification mode is a single-step verification mode.

14. The method of claim 1, further comprising:

generating memory cell designation data; and designating the memory cell as either a slow memory cell or a fast memory cell on the basis of the memory cell designation data.

15. The method of claim 14, wherein the generating of the memory cell designation data is performed during the verification operation.

16. The method of claim 15, further comprising:

storing the memory cell designation data in the nonvolatile memory device during the verification operation.

17. A method of programming a multi-level memory cell (MLC) configured to store data including a least significant bit (LSB) and a most significant bit (MSB) within a nonvolatile memory device, the method comprising:

executing an i-th programming interval comprising a LSB programming operation followed by a MSB programming operation, wherein the MSB programming operation comprises;
    applying an i-th programming voltage to a word line connected to the MLC and applying either (1) a bit line forcing voltage to a bit line connected to the memory cell if the memory cell is a fast memory cell having a threshold voltage that resides in one of a group of proximate threshold voltage ranges, each one of the group of proximate threshold voltage ranges being less than a respective target threshold voltage distribution, or (2) a bit line program voltage less than the bit line forcing voltage to the bit line if the memory cell is a slow memory cell having a threshold voltage that resides in one of a group of distant threshold voltage ranges, each one of the group of distant threshold voltage ranges being less than a respective proximate threshold voltage range;
    evaluating a programming condition;
    selecting a verification mode from a group of verification modes on the basis of the evaluated programming condition; and
    executing a verification operation using the selected verification mode.

18. The method of claim 17, wherein the verification operation comprises:
    determining that the MLC is a pass memory cell when the threshold voltage of the MLC resides in one of a group of threshold voltage distributions, including an erase threshold voltage distribution associated with an erase state, a first threshold voltage distribution higher than the erase threshold voltage distribution and associated with a first program state, a second threshold voltage distribution higher than the first threshold voltage distribution and associated with a second program state, and a third threshold voltage distribution higher than the second threshold voltage distribution and associated with a third program state;
    determining that the MLC is a fast memory cell when the threshold voltage of the MLC resides in one of the group of proximate threshold voltage ranges, including a first proximate threshold voltage range less than the first threshold voltage distribution, a second proximate threshold voltage range less than the second threshold voltage distribution, and a third proximate threshold voltage range less than the third threshold voltage distribution; and
    determining that the MLC is a slow memory cell when the threshold voltage of the MLC is less than the third proximate threshold voltage range but greater than the second threshold voltage distribution, less than the second proximate threshold voltage range but greater than the first threshold voltage distribution, or less than the first proximate threshold voltage range but greater than the erase threshold distribution.

19. A method of operating a nonvolatile memory device, comprising:
    executing an i-th programming interval of a programming operation directed to a memory cell by applying an i-th programming voltage to a word line connected to the memory cell and applying either (1) a bit line forcing voltage to a bit line connected to the memory cell if the memory cell is a fast memory cell having a threshold voltage that resides in a proximate threshold voltage range less than a target threshold voltage distribution, or (2) a bit line program voltage less than the bit line forcing voltage to the bit line if the memory cell is a slow memory cell having a threshold voltage that resides in a distant threshold voltage range less than the proximate threshold voltage range;
    comparing a current threshold voltage of the memory cell to a pass threshold voltage;
    if the current threshold voltage is less than the pass threshold voltage selecting a first verification mode; and
    if the current threshold voltage is greater than or equal to the pass threshold voltage selecting a second verification mode.

20. The method of claim 19, wherein the first verification mode is a multiple-step verification mode and the second verification mode is a single-step verification mode.

* * * * *